United States Patent
Shibutani et al.

[11] Patent Number: 6,043,521
[45] Date of Patent: Mar. 28, 2000

[54] LAYOUT PATTERN OF MEMORY CELL CIRCUIT

[75] Inventors: Koji Shibutani; Koji Nii, both of Tokyo, Japan

[73] Assignee: Mitsubishi Denki Kabushiki Kaisha, Tokyo, Japan

[21] Appl. No.: 08/984,528

[22] Filed: Dec. 3, 1997

[30]     Foreign Application Priority Data

Aug. 1, 1997   [JP]   Japan .................................... 9-208169

[51] Int. Cl.⁷ .......................... H01L 27/11; H01L 27/118; H01L 27/092

[52] U.S. Cl. .......................... 257/206; 257/369; 257/401; 257/903

[58] Field of Search .................................... 257/204, 206, 257/369, 401, 903

[56]     References Cited

U.S. PATENT DOCUMENTS

| | | | |
|---|---|---|---|
| 5,083,178 | 1/1992 | Otsu | 257/903 |
| 5,422,840 | 6/1995 | Naiki | 257/903 |
| 5,452,245 | 9/1995 | Hickman et al. | 257/206 |
| 5,594,270 | 1/1997 | Hiramoto et al. | 257/903 |

FOREIGN PATENT DOCUMENTS 196 01 847  7/1996  Germany.
6/326247   11/1994  Japan.

*Primary Examiner*—Gene M. Munson
*Attorney, Agent, or Firm*—Burns, Doane, Swecker & Mathis, LLP

[57]             ABSTRACT

A layout pattern of a memory cell circuit has a plurality of basic cells. Each basic cell has a small aspect ratio. Each basic cell has a NMOS transistor and a PMOS transistor. In the layout pattern, one basic cell is arranged in each row direction and the sixteen basic cells are arranged in each column direction.

17 Claims, 7 Drawing Sheets

LAYOUT PATTERN OF MEMORY CELL CIRCUIT

BACKGROUND OF THE INVENTION

1. Field of the Invention

The present invention relates to a memory cell circuit comprising a plurality of memory cells and a layout pattern thereof, and, more particularly, to a memory cell circuit and a layout pattern of a highly integrated memory cell circuit comprising memory cell arrays in which each memory cell has a small aspect ratio.

2. Description of the Prior Art

First conventional example

FIG. 6 is a diagram showing a layout pattern of conventional memory cells to form a memory cell array in a memory cell circuit. For example, the memory cell circuit has a configuration shown in FIG. 1. In FIG. 6, the reference characters n1 to n16 designate first to sixteenth N conductivity type Metal Oxide Semiconductor (NMOS) transistors, respectively. The reference characters p1 to p16 denote first to sixteenth P conductivity type Metal Oxide Semiconductor (PMOS) transistors, respectively. In addition, the reference characters Gn1 to Gn16 indicate gate electrodes of the first to sixteenth NMOS transistors n1 to n16, Sn1 to Sn16 designate source regions of the first to sixteenth NMOS transistors n1 to n16, and Dn1 to Dn16 denote drain regions of the first to sixteenth NMOS transistors n1 to n16, respectively. The reference characters Gp1 to Gp16 designate gate electrodes of the first to sixteenth PMOS transistors p1 to p16. The reference characters Sp2, Sp3, Sp6, Sp8, Sp9, Sp10, Sp11, Sp14, and Sp15 denote source regions of the second, third, sixth, eighth, ninth, tenth, eleventh, fourteenth, and fifteenth PMOS transistors p2, p3, p6, p8, p9, p10, p11, p14, and p15, respectively.

The reference characters Dp2, Dp3, Dp6, Dp8, Dp9, Dp10, Dp11, Dp14, and Dp15 indicate drain regions of the second, third, sixth, eighth, ninth, tenth, eleventh, fourteenth, and fifteenth PMOS transistors p2, p3, p6, p8, p9, p10, p11, p14, and p15, respectively.

The reference character W0BL designates a first write-in bit line made up of a first layer wiring, W0BLC denotes a second write-in bit line made up of the first layer wiring, W0WL0 designates a first write-in word line made up of a second layer wiring, W0WL1 denotes a second write-in word line made up of the second layer wiring, R1WL0 designates a first read-out word line made up of the second layer wiring, R1WL1 denotes a second read-out word line made up of the second layer wiring, and R1BL indicates a read-out bit line made up of the first layer wiring.

The reference character VDD designates a power source line made up of the first layer wiring, and GND indicates a ground line made up of the first layer wiring.

The first layer wiring is formed on the NMOS transistors and the PMOS transistors and the second layer wiring is formed on the first layer wiring.

In FIG. 6, the first layer wirings are shown by using solid lines and the second layer wiring by using hatching lines. In addition, in FIG. 6, open quadrilaterals indicate contact holes through which the first layer wirings are electrically connected to the gate electrodes, the source regions, and the drain regions, and quadrilaterals including a symbol "X" denotes bi-holes through which the first layer wirings and the second layer wirings are connected electrically.

As shown in FIG. 6, in the conventional layout pattern of the memory cell in order to form the memory cell circuit shown in FIG. 1, a row direction is a direction of the transistor array and a direction on which the transistor arrays are adjacent to each other is a column direction. A basic cell comprises a pair of the NMOS transistor and the PMOS transistor. In addition, the two basic cells in row direction and the eight basic cells in column directions are formed, and a plurality of word lines are formed in the row direction and a plurality of bit lines are formed in the column direction.

Second conventional example.

FIG. 7 is a diagram showing a layout pattern of another conventional memory cells to form a memory cell circuit, for example it having the configuration shown in FIG. 4. In FIG. 7, the reference characters n1 to n16 designate first to sixteenth NMOS transistors, respectively. The reference characters p1 to p16 denote first to sixteenth P MOS transistors, respectively. In addition, the reference characters Gn1 to Gn16 indicate gate electrodes of the first to sixteenth NMOS transistors n1 to n16, Sn1 to Sn12 designate source regions of the first to eleventh NMOS transistors n1 to n12, and Dn1 to Dn12 denote drain regions of the first to eleventh NMOS transistors n1 to n12, respectively. The reference characters Gp1 to Gp16 designate gate electrodes of the first to sixteenth PMOS transistors p1 to p16. The reference characters Sp2, Sp3, Sp6, Sp7, Sp8, Sp9, Sp10, and Sp11 denote source regions of the second, third, sixth, seventh, eighth, ninth, tenth, and eleventh PMOS transistors p2, p3, p6, p7, p8, p9, p10, and p11, respectively. The reference characters Dp2, Dp3, Dp6, Dp7, Dp8, Dp9, Dp10, and Dp11 indicate drain regions of the second, third, sixth, seventh, eighth, ninth, tenth, and eleventh PMOS transistors p2, p3, p6, p7, p8, p9, p10, and p11, respectively.

The reference character W0BL designates a first write-in bit line made up of a first layer wiring, W0BLC denotes a second write-in bit line made up of the first layer wiring, W0WL0 designates a first write-in word line made up of a second layer wiring, W0WL1 denotes a second write-in word line made up of the second layer wiring, R1WL0 designates a first read-out word line made up of the second layer wiring, R1WL1 denotes a second read-out word line made up of the second layer wiring, and R1BL indicates a read-out bit line made up of the first layer wiring.

The reference character VDD designates a power source line made up of the first layer wiring, and GND indicates a ground line made up of the first layer wiring. The first layer wiring is formed on the NMOS transistors and the PMOS transistors and the second layer wiring is formed on the first layer wiring.

In FIG. 7, the first layer wiring is shown by using solid lines and the second layer wiring by using hatching lines. In addition, in FIG. 7, open quadrilaterals indicate contact holes through which the first layer wiring is electrically connected to the gate regions (or gate electrodes), the source regions, and the drain regions, and quadrilaterals including a symbol "X" denotes bi-holes through which the first layer wirings and the second layer wirings are connected electrically.

As shown in FIG. 7, in the conventional layout pattern of the memory cell in order to form the memory cell circuit shown in FIG. 4, a row direction is a direction of the transistor array and a direction on which the transistor arrays are adjacent to each other is a column direction. A basic cell comprises a pair of the NMOS transistor and the PMOS transistor. In addition, the two basic cells in row direction and the eight basic cells in column directions are formed, and a plurality of word lines are formed in the row direction and a plurality of bit lines are formed in the column direction.

Because the conventional memory cell layout pattern has the configuration described above shown in FIGS. 6 and 7, there is a drawback that the aspect ratio of each memory cell is large. That is, the aspect ratio of each memory cell is a ratio of a length and a wide of each memory cell, or a ratio of a rectangular length (in row direction) and a lateral length (in column direction) of each memory cell. In the conventional memory cell array in which conventional memory cells are arranged in a array shape, the length in the rectangle direction (along the row direction) depends on the number of bits and the length in the lateral direction (along the column direction) depends on the number of words. Thereby, when the number of bits is greater, the aspect ratio of each memory cell is also greater, so that there is a drawback that it is difficult to form wiring in a semiconductor chip because a shape of a Random Access Memory (RAM) having a large number of bits becomes a depth form when the RAM is fabricated by using a plurality of memory cells having a larger aspect ratio.

SUMMARY OF THE INVENTION

Accordingly, an object of the present invention is, with due consideration to the drawbacks of the conventional memory cell layout pattern, to provide a memory cell layout pattern of a memory cell circuit comprising memory cell arrays in which a plurality of memory cells, each having a smaller aspect ratio, are arranged. In addition, another object of the present invention is to provide a memory cell layout pattern of memory cell arrays in which a highly integrated memory cells having a smaller area are arranged.

In accordance with a preferred embodiment of the present invention, a layout pattern of a memory cell circuit comprises: a first memory circuit comprising a first and second invertors connected in parallel reversely, for storing data and outputting the data through an output terminal of the first invertor; a second memory circuit comprising a third and fourth invertors connected in parallel reversely, for storing data and outputting the data through an output terminal of the third invertor; first and second write-in bit lines on which complementary signals to each other are transferred in order to store data one of the first and second memory circuits; a first transistor of a second conductivity type whose drain is connected to the output terminal of the first invertor, and whose source is connected to the second write-in bit line; a second transistor of the second conductivity type whose drain is connected to the output terminal of the second invertor, and whose source is connected to the first write-in bit line; a third transistor of the second conductivity type whose drain is connected to the output terminal of the third invertor, and whose source is connected to the second write-in bit line; a fourth transistor of the second conductivity type whose drain is connected to the output terminal of the fourth invertor, and whose source is connected to the first write-in bit line; a first write-in word line connected commonly to both gates of the first and second transistors of the second conductivity type and for controlling a write operation to the first memory circuit through the first and second write-in bit lines; a second write-in word line connected commonly to both gates of the third and fourth transistors of the second conductivity type and for controlling a write operation to the second memory circuit through the first and second write-in bit lines; first and second read-out word lines, an inactive signal is usually supplied to one of the first and second read-out word lines; a read-out bit line; a read-out circuit for providing data stored in the first and second memory circuits to the read-out bit line based on active and inactive signals supplied to the first and second read-out word lines; a first voltage potential line through which a first voltage potential is supplied; a second voltage potential line through which a second voltage potential that is different from the first voltage potential in potential is supplied.

In the layout pattern of a memory cell circuit as another preferred embodiment of the present invention, the first inverter comprises: a first transistor of a first conductively type, whose gate is connected to the output terminal of the second invertor, whose source is connected to the first voltage potential line, and whose drain is connected to the output terminal of the first inverter; and a fifth transistor of the second conductively type, whose gate is connected to the output terminal of the second invertor, whose source is connected to the second voltage potential line, and whose drain is connected to the output terminal of the first inverter, the second inverter comprises: a second transistor of the first conductively type, whose gate is connected to the output terminal of the first invertor, whose source is connected to the first voltage potential line, and whose drain is connected to the output terminal of the second inverter; and a sixth transistor of the second conductively type, whose gate is connected to the output terminal of the first invertor, whose source is connected to the second voltage potential line, and whose drain is connected to the output terminal of the second invertor, the third inverter comprises: a third transistor of the first conductively type, whose gate is connected to the output terminal of the fourth invertor, whose source is connected to the first voltage potential line, and whose drain is connected to the output terminal of the third inverter; and a seventh transistor of the second conductively type, whose gate is connected to the output terminal of the fourth invertor, whose source is connected to the second voltage potential line, and whose drain is connected to the output terminal of the third inverter, and the fourth inverter comprises: a fourth transistor of the first conductively type, whose gate is connected to the output terminal of the third invertor, whose source is connected to the first voltage potential line, and whose drain is connected to the output terminal of the fourth inverter; and an eighth transistor of the second conductively type, whose gate is connected to the output terminal of the third invertor, whose source is connected to the second voltage potential line, and whose drain is connected to the output terminal of the fourth inverter.

In the layout pattern of a memory cell circuit as another preferred embodiment of the present invention, the read-out circuit comprises: a complex logical circuit comprising: a first input terminal connected to the second memory circuit; a second input terminal connected to the second read-out word line; a third input terminal connected to the first memory circuit; a fourth input terminal connected to the first read-out word line; and an output terminal, a fifth transistor of the first conductivity type, whose source is connected to the first voltage potential line, whose gate is connected to the output terminal of the complex logical circuit, and whose drain is connected to the read-out bit line; a ninth transistor of the second conductivity type, whose source is connected to the second voltage potential line, and whose gate is connected to the output terminal of the complex logical circuit; a tenth transistor of the second conductivity type, whose source is connected to the drain of the ninth transistor of the second conductivity type, whose gate is connected to the first read-out word line, and whose drain is connected to the read-out bit line; an eleventh transistor of the second conductivity type, whose source is connected to the second voltage potential line, and whose gate is connected to the output terminal of the complex logical circuit; and a twelfth transistor of the second conductivity type, whose source is connected to the drain of the eleventh transistor of the second conductivity type, whose gate is connected to the second read-out word line, and whose drain is connected to the read-out bit line.

In the layout pattern of a memory cell circuit as another preferred embodiment of the present invention, the complex logical circuit comprises: a sixth transistor of the first conductivity type, whose drain is connected to the output terminal of the complex logical circuit, whose gate is connected to the fourth input terminal of the complex logical circuit; a seventh transistor of the first conductivity type, whose drain is connected to the output terminal of the complex logical circuit, whose gate is connected to the third input terminal of the complex logical circuit, and whose source is connected to a source of the sixth transistor of the first conductivity type; an eighth transistor of the first conductivity type, whose drain is connected to the source of the sixth transistor of the first conductivity type, whose gate is connected to the first input terminal of the complex logical circuit, and whose source is connected to the first voltage potential line; a ninth transistor of the first conductivity type, whose drain is connected to the source of the seventh transistor of the first conductivity type, whose gate is connected to the second input terminal of the complex logical circuit, and whose source is connected to the first voltage potential line; a thirteenth transistor of the second conductivity type, whose source is connected to the second voltage potential line, and whose gate is connected to the fourth input terminal of the complex logical circuit; a fourteenth transistor of the second conductivity type, whose drain is connected to the drain of the thirteenth transistor of the second conductivity type, whose gate is connected to the third input terminal of the complex logical circuit, and whose gate is connected to the third input terminal of the complex logical circuit; a fifteenth transistor of the second conductivity type, whose gate is connected to the first input terminal of the complex logical circuit, and whose drain is connected to the output terminal of the complex logical circuit; and a sixteenth transistor of the second conductivity type, whose drain is connected to the source of the fifteenth transistor of the second conductivity type, whose gate is connected to the second input terminal of the complex logical circuit, and whose source is connected to the second voltage potential line.

In the layout pattern of a memory cell circuit as another preferred embodiment of the present invention, a transistor array of a first row comprising the transistors of the second conductivity type is arranged in a first row, a transistor array of a second row comprising the transistors of the first conductivity type is arranged in a second row, and the transistors in the first and second transistor array are arranged along each column.

In the transistor array of the first row, the third transistor of the second conductivity type is arranged in a first column, the seventh transistor of the second conductivity type is arranged in a second column, the eighth transistor of the second conductivity type is arranged in a third column, the fourth transistor of the second conductivity type is arranged in a fourth column, the second transistor of the second conductivity type is arranged in a fifth column, the sixth transistor of the second conductivity type is arranged in a sixth column, the sixteenth transistor of the second conductivity type is arranged in a seventh column, the fifteenth transistor of the second conductivity type is arranged in an eighth column, the fourteenth transistor of the second conductivity type is arranged in a ninth column, the thirteenth transistor of the second conductivity type is arranged in a tenth column, the ninth transistor of the second conductivity type is arranged in an eleventh column, the tenth transistor of the second conductivity type is arranged in a twelfth column, the twelfth transistor of the second conductivity type is arranged in a thirteenth column, the eleventh transistor of the second conductivity type is arranged in a fourteenth column, the fifth transistor of the second conductivity type is arranged in a fifteenth column, and the first transistor of the second conductivity type is arranged in a sixteenth column.

In the transistor array of the first row, each pair of following two regions is formed in a same region:
the drain region of the third transistor of the second conductivity type and the drain region of the seventh transistor of the second conductivity type;
the source region of the seventh transistor of the second conductivity type and the source region of the eighth transistor of the second conductivity type;
the drain region of the eighth transistor of the second conductivity type and the drain region of the fourth transistor of the second conductivity type;
the source region of the fourth transistor of the second conductivity type and the source region of the second transistor of the second conductivity type;
the drain region of the second transistor of the second conductivity type and the drain region of the sixth transistor of the second conductivity type;
the source region of the sixth transistor of the second conductivity type and the source region of the sixteenth transistor of the second conductivity type;
the drain region of the sixteenth transistor of the second conductivity type and the source region of the fifteenth transistor of the second conductivity type;
the drain region of the fifteenth transistor of the second conductivity type and the source region of the fourteenth transistor of the second conductivity type;
the drain region of the fourteenth transistor of the second conductivity type and the drain region of the thirteenth transistor of the second conductivity type;
the source region of the thirteenth transistor of the second conductivity type and the source region of the ninth transistor of the second conductivity type;
the drain region of the ninth transistor of the second conductivity type and the source region of the tenth transistor of the second conductivity type;
the drain region of the tenth transistor of the second conductivity type and the drain region of the twelfth transistor of the second conductivity type;
the source region of the eleventh transistor of the second conductivity type and the source region of the fifth transistor of the second conductivity type; and
the drain region of the fifteenth transistor of the second conductivity type and the drain region of the first transistor of the second conductivity type.

In the transistor array of the second row, the third transistor of the first conductivity type is arranged in a second column, the fourth transistor of the first conductivity type is arranged in a third column, the second transistor of the first conductivity type is arranged in a sixth column, the eighth transistor of the first conductivity type is arranged in an eighth column, the seventh transistor of the first conductivity type is arranged in a ninth column, the sixth transistor of the first conductivity type is arranged in a tenth column, the ninth transistor of the first conductivity type is arranged in an eleventh column, the fifth transistor of the first conductivity type is arranged in a fourteenth column, and the first transistor of the first conductivity type is arranged in a fifteenth column.

In the transistor array of the second row, each pair of following two regions is formed in a same region: the source region of the third transistor of the first conductivity type and the source region of the fourth transistor of the first conductivity type; the drain region of the eighth transistor of the first conductivity type and the source region of the seventh transistor of the first conductivity type; the drain region of the seventh transistor of the first conductivity type and the drain region of the sixth transistor of the first conductivity type; the drain region of the sixth transistor of the first conductivity type and the drain region of the ninth transistor of the first conductivity type; and the source region of the fifth transistor of the first conductivity type and the source region of the first transistor of the first conductivity type.

In addition, in the layout pattern of the memory cell circuit, the first and second write-in bit lines are made up of a first layer wiring, the first and second write-in word lines formed on the first layer wiring are made up of a second layer wiring, the read-out word lines are made up of the second layer wiring, the read-out bit line is made up of the first layer wiring, and the first and second voltage potential lines are made up of the first layer wiring.

In accordance with another preferred embodiment of the present invention, a layout pattern of a memory cell circuit comprises:

a first memory circuit comprising a first and second invertors connected in parallel reversely, for storing data and outputting the data through an output terminal of the first invertor;

a second memory circuit comprising a third and fourth invertors connected in parallel reversely, for storing data and outputting the data through an output terminal of the third invertor;

first and second write-in bit lines on which complementary signals to each other are transferred in order to store data one of the first and second memory circuits;

a first transistor of a second conductivity type whose drain is connected to the output terminal of the first invertor, and whose source is connected to the second write-in bit line;

a second transistor of the second conductivity type whose drain is connected to the output terminal of the second invertor, and whose source is connected to the first write-in bit line;

a third transistor of the second conductivity type whose drain is connected to the output terminal of the third invertor, and whose source is connected to the second write-in bit line;

a fourth transistor of the second conductivity type whose drain is connected to the output terminal of the fourth invertor, and whose source is connected to the first write-in bit line;

a first write-in word line connected commonly to both gates of the first and second transistors of the second conductivity type and for controlling a write operation to the first memory circuit (1) through the first and second write-in bit lines;

a second write-in word line connected commonly to both gates of the third and fourth transistors of the second conductivity type and for controlling a write operation to the second memory circuit through the first and second write-in bit lines;

first and second read-out word lines, an inactive signal is usually supplied to one of the first and second read-out word lines;

a read-out bit line;

a read-out circuit for providing data stored in the first and second memory circuits to the read-out bit line based on active and inactive signals supplied to the first and second read-out word lines;

a first voltage potential line through which a first voltage potential is supplied;

a second voltage potential line through which a second voltage potential that is different from the first voltage potential in potential is supplied.

In the layout pattern of a memory cell circuit as another preferred embodiment of the present invention, the first inverter comprises: a first transistor of a first conductively type, whose gate is connected to the output terminal of the second invertor, whose source is connected to the first voltage potential line, and whose drain is connected to the output terminal of the first inverter; and a fifth transistor of the second conductively type, whose gate is connected to the output terminal of the second invertor, whose source is connected to the second voltage potential line, and whose drain is connected to the output terminal of the first inverter, the second inverter comprises: a second transistor of the first conductively type, whose gate is connected to the output terminal of the first invertor, whose source is connected to the first voltage potential line, and whose drain is connected to the output terminal of the second inverter; and a sixth transistor of the second conductively type, whose gate is connected to the output terminal of the first invertor, whose source is connected to the second voltage potential line, and whose drain is connected to the output terminal of the second inverter, the third inverter comprises: a third transistor of the first conductively type, whose gate is connected to the output terminal of the fourth invertor, whose source is connected to the first voltage potential line, and whose drain is connected to the output terminal of the third inverter; and a seventh transistor of the second conductively type, whose gate is connected to the output terminal of the fourth invertor, whose source is connected to the second voltage potential line, and whose drain is connected to the output terminal of the third inverter, and the fourth inverter comprises: a fourth transistor of the first conductively type, whose gate is connected to the output terminal of the third invertor, whose source is connected to the first voltage potential line, and whose drain is connected to the output terminal of the fourth inverter; and an eighth transistor of the second conductively type, whose gate is connected to the output terminal of the third invertor, whose source is connected to the second voltage potential line, and whose drain is connected to the output terminal of the fourth inverter.

In the layout pattern of a memory cell circuit as another preferred embodiment of the present invention, the read-out circuit comprises: a first input terminal connected to the second memory circuit; a second input terminal connected to the second read-out word line; a third input terminal connected to the first memory circuit; a fourth input terminal connected to the first read-out word line; a ninth transistor of the second conductivity type, whose source is connected to the second input terminal of the read-out circuit, and whose gate is connected to the second input terminal of the read-out circuit; a tenth transistor of the second conductivity type, whose drain is connected to the source of the ninth transistor of the second conductivity type, whose gate is connected to the first input terminal of the read-out circuit, and whose source is connected to the second voltage potential line; a fifth transistor of the first conductivity type, whose drain is connected to the source of the ninth transistor of the second conductivity type, whose gate is connected to the first input terminal of the read-out circuit, and whose source is connected to the first voltage potential line; a sixth transistor of the first conductivity type, whose drain is connected to the source of the ninth transistor of the second conductivity type, whose gate is connected to the first input terminal of the read-out circuit, and whose source is connected to the first voltage potential line; an eleventh transistor of the second conductivity type, whose drain is connected to the read-out bit line, whose gate is connected to the fourth input terminal of the read-out circuit, and whose source is connected to the eleventh transistor of the second conductivity type; a twelfth transistor of the second conductivity type, whose drain is connected to the source of the eleventh transistor of the second conductivity type, whose gate is connected to the third input terminal of the read-out circuit, and whose source is connected to the second voltage potential line; a seventh transistor of the first conductivity type, whose drain is connected to the source of the eleventh transistor of the second conductivity type, whose gate is connected to the third input terminal of the read-out circuit, and whose source is connected to the first voltage potential line; an eighth transistor of the second conductivity type, whose drain is connected to the source of the eleventh transistor of the second conductivity type, whose gate is connected to the third input terminal of the read-out circuit, and whose source is connected to the first voltage potential line.

In the layout pattern of a memory cell circuit as another preferred embodiment of the present invention, a transistor array of a first row comprising the transistors of the second conductivity type is arranged in a first row, a transistor array of a second row comprising the transistors of the first conductivity type is arranged in a second row, and the transistors in the first and second transistor array are arranged along each column, In the transistor array of the first row, the third transistor of the second conductivity type is arranged in a first column, the seventh transistor of the second conductivity type is arranged in a second column, the eighth transistor of the second conductivity type is arranged in a third column, the fourth transistor of the second conductivity type is arranged in a fourth column, the second transistor of the second conductivity type is arranged in a fifth column, the sixth transistor of the second conductivity type is arranged in a sixth column, the tenth transistor of the second conductivity type is arranged in a seventh column, the ninth transistor of the second conductivity type is arranged in an eighth column, the eleventh transistor of the second conductivity type is arranged in a ninth column, the twelfth transistor of the second conductivity type is arranged in a tenth column, the fifth transistor of the second conductivity type is arranged in an eleventh column, and the first transistor of the second conductivity type is arranged in a twelfth column.

In the transistor array of the first row, each pair of following two regions is formed in a same region:

the drain region of the third transistor of the second conductivity type and the drain region of the seventh transistor of the second conductivity type;

the source region of the seventh transistor of the second conductivity type and the source region of the eighth transistor of the second conductivity type;

the drain region of the eighth transistor of the second conductivity type and the drain region of the fourth transistor of the second conductivity type;

the source region of the fourth transistor of the second conductivity type and the source region of the second transistor of the second conductivity type;

the drain region of the second transistor of the second conductivity type and the drain region of the sixth transistor of the second conductivity type;

the source region of the sixth transistor of the second conductivity type and the source region of the tenth transistor of the second conductivity type;

the drain region of the tenth transistor of the second conductivity type and the source region of the ninth transistor of the second conductivity type;

the drain region of the ninth transistor of the second conductivity type and the drain region of the eleventh transistor of the second conductivity type;

the source region of the eleventh transistor of the second conductivity type and the drain region of the twelfth transistor of the second conductivity type;

the source region of the twelfth transistor of the second conductivity type and the source region of the fifth transistor of the second conductivity type; and the drain region of the fifth transistor of the second conductivity type and the drain region of the first transistor of the second conductivity type.

In the transistor array of the second row, the third transistor of the first conductivity type is arranged in a second column, the fourth transistor of the first conductivity type is arranged in a third column, the second transistor of the first conductivity type is arranged in a sixth column, the fifth transistor of the first conductivity type is arranged in a seventh column, the sixth transistor of the first conductivity type is arranged in an eighth column, the seventh transistor of the first conductivity type is arranged in a ninth column, the eighth transistor of the first conductivity type is arranged in a tenth column, and the first transistor of the first conductivity type is arranged in an eleventh column.

In the transistor array of the second row, each pair of following two regions is formed in a same region:

the source region of the third transistor of the first conductivity type and the source region of the fourth transistor of the first conductivity type;

the source region of the second transistor of the first conductivity type and the source region of the fifth transistor of the first conductivity type;

the drain region of the fifth transistor of the first conductivity type and the drain region of the sixth transistor of the first conductivity type;

the source region of the sixth transistor of the first conductivity type and the source region of the seventh transistor of the first conductivity type;

the drain region of the seventh transistor of the first conductivity type and the drain region of the eighth transistor of the first conductivity type, and the source region of the eighth transistor of the first conductivity type and the source region of the first transistor of the first conductivity type.

In the layout pattern of the memory cell circuit, the first and second write-in bit lines are made up of a first layer wiring, the first and second write-in word lines formed on the first layer wiring are made up of a second layer wiring, the read-out word lines are made up of the second layer wiring, the read-out bit line is made up of the first layer wiring, and the first and second voltage potential lines are made up of the first layer wiring.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

Preferred embodiments of a memory cell layout pattern according to the present invention will now be described with reference to the drawings.

First embodiment

Figure 1:
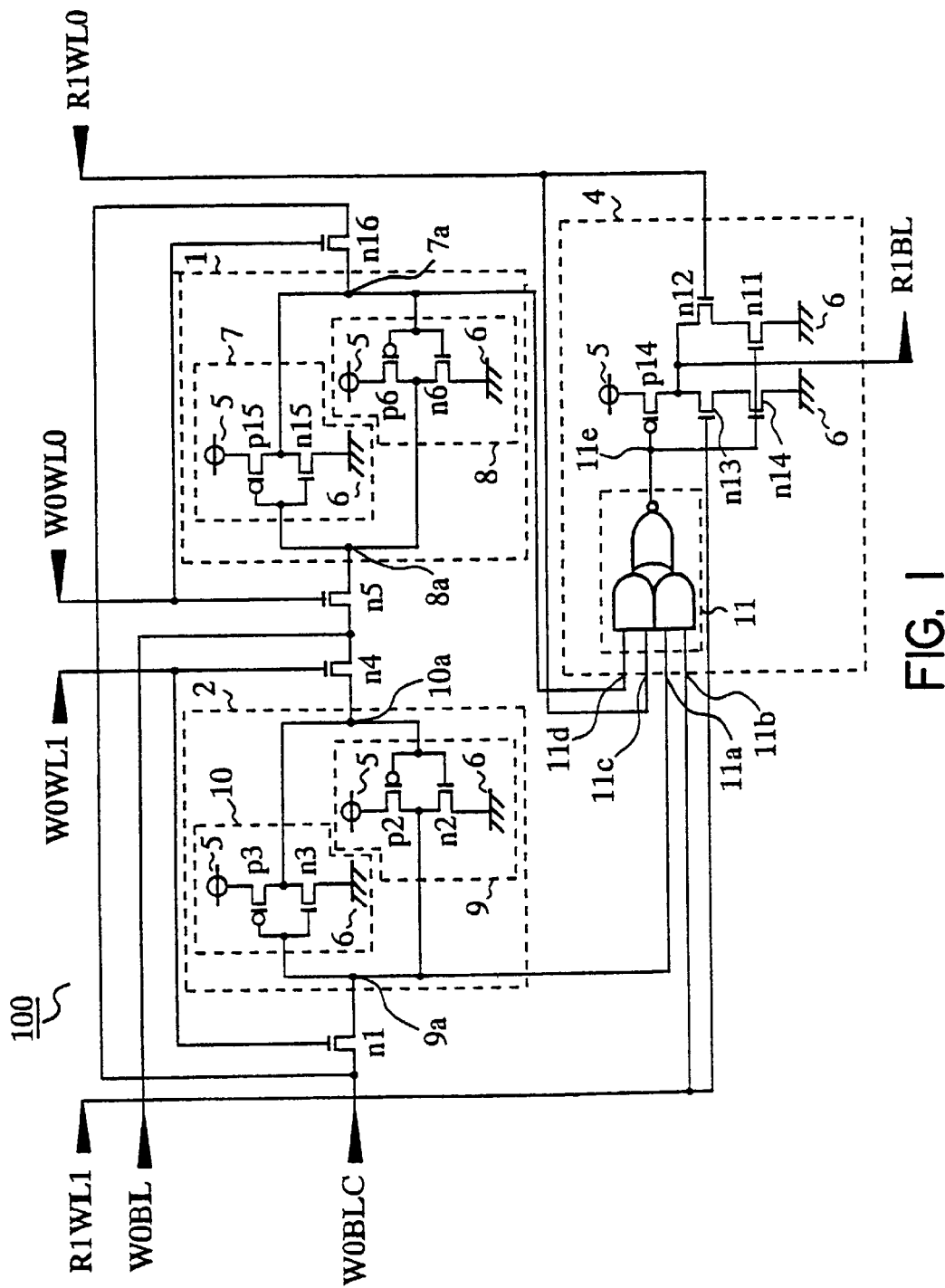
FIG. 1 is a diagram showing a configuration of a memory cell circuit according to a first embodiment of the present invention.
Figure 2:
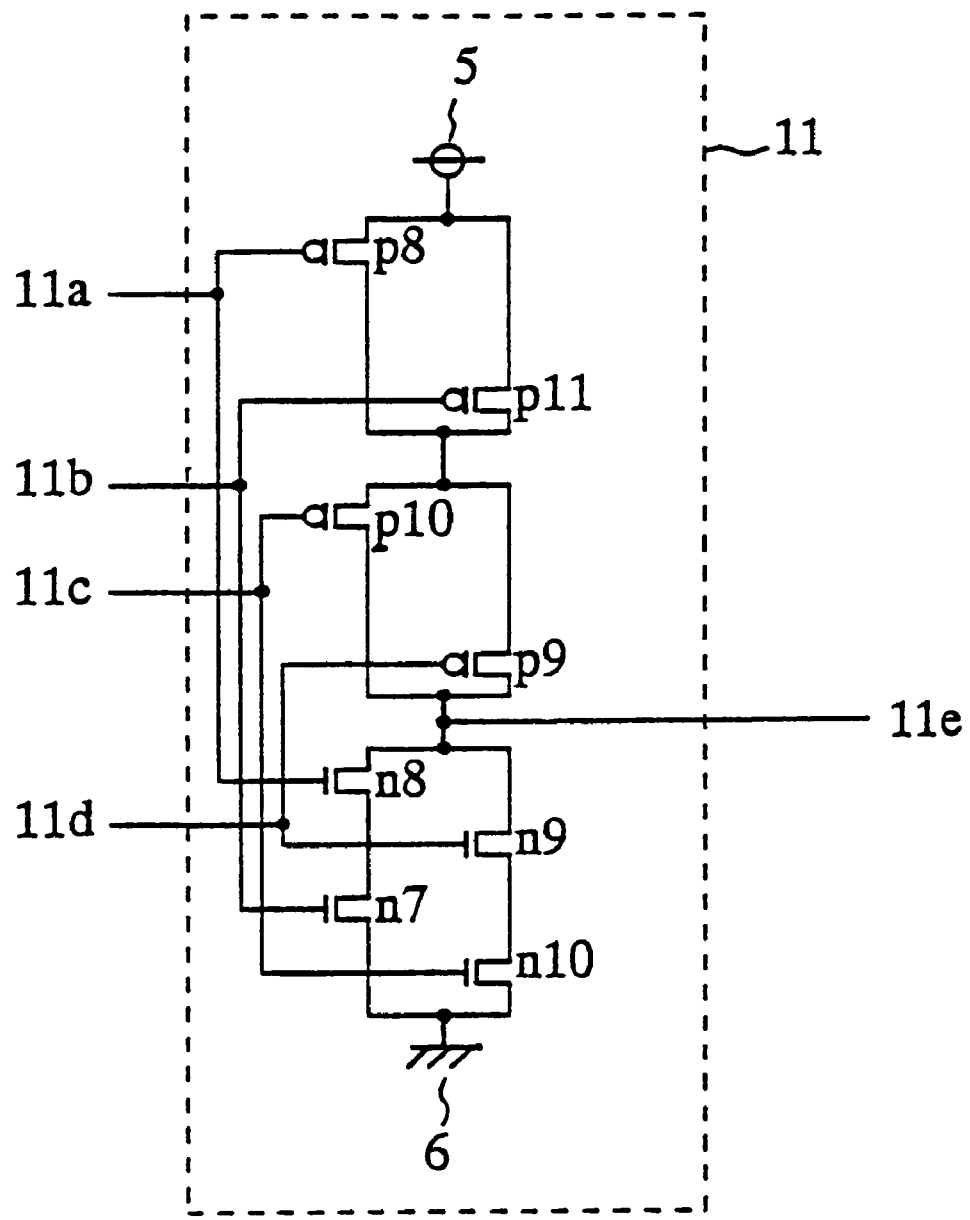
FIG. 2 is a diagram showing a configuration of a complex logical circuit incorporated in the memory cell circuit of the first embodiment shown in FIG. 1.

FIG. 1 is a diagram showing a configuration of a memory cell circuit 100 according to the first embodiment of the present invention. FIG. 2 is a diagram showing a configuration of a complex logical circuit 11 incorporated in the memory cell circuit 100 shown in FIG. 1.

The configuration of the memory cell circuit 100 shown in FIGS. 1 and 2 and the layout pattern of the memory cell circuit 100 shown in FIG. 3 according to the first embodiment will be explained in detail before describing the operation of the memory cell circuit 100.

Configuration of the memory cell circuit 100

At first, the configuration of the memory cell circuit 100 will be explained in detail.

In both FIGS. 1 and 2, the reference number 1 designates a first memory circuit, 2 indicates a second memory circuit, 4 denotes a read-out circuit, 5 designates a power source line (a first voltage potential line), and 6 indicates a ground line (a second voltage potential line). The reference number 7 designates a first inverter, 8 denotes a second inverter, 9 indicates a third inverter, and 10 designates a fourth inverter. The reference character 7a designates an output terminal of the first inverter 7, 8a denotes an output terminal of the second inverter 8, 9a indicates an output terminal of the third inverter 9, and 10a denotes an output terminal of the fourth inverter 10. The reference number 11 designates a complex logical circuit, 11a, 11b, 11c, 11d, and 11e denote a first input terminal, a second input terminal, a third input terminal, a fourth input terminal, and an output terminal of the complex logical circuit 11, respectively. The reference characters W0BL, W0BLC, W0WL0, W0WL1, R1WL0, R1WL1, and R1BL indicate a first write-in bit line, a second write-in bit line, a first write-in word line, a second write-in word line, a first read-out word line, a second read-out word line, and a read-out bit line, respectively.

The reference characters n1 to n16 designate first to sixteenth N conductivity type Metal Oxide Semiconductor (NMOS) transistors, respectively. These first to sixteenth NMOS transistors n1 to n16 incorporated in the memory cell circuit 100 have the following relationship:

The first NMOS transistor n1 corresponds to a third transistor of a second conductivity type;

The second NMOS transistor n2 corresponds to a seventh transistor of the second conductivity type;

The third NMOS transistor n3 corresponds to an eighth transistor of the second conductivity type;

The fourth NMOS transistor n4 corresponds to a fourth transistor of the second conductivity type;

The fifth NMOS transistor n5 corresponds to a second transistor of the second conductivity type;

The sixth NMOS transistor n6 corresponds to a sixth transistor of the second conductivity type;

The seventh NMOS transistor n7 corresponds to a sixteenth transistor of the second conductivity type;

The eighth NMOS transistor n8 corresponds to a fifteenth transistor of the second conductivity type;

The ninth NMOS transistor n9 corresponds to a fourteenth transistor of the second conductivity type;

The tenth NMOS transistor n10 corresponds to a thirteenth transistor of the second conductivity type;

The eleventh NMOS transistor n11 corresponds to a ninth transistor of the second conductivity type;

The twelfth NMOS transistor n12 corresponds to a tenth transistor of the second conductivity type;

The thirteenth NMOS transistor n13 corresponds to a twelfth transistor of the second conductivity type;

The fourteenth NMOS transistor n14 corresponds to a eleventh transistor of the second conductivity type;

The fifteenth NMOS transistor n15 corresponds to a fifth transistor of the second conductivity type; and The sixteenth NMOS transistor n16 corresponds to a first transistor of the second conductivity type.

The reference characters p2, p3, p6, p8, p9, p10, p11, p14, and p15 indicate second, third, sixth, eighth, ninth, tenth, eleventh, fourteenth, and fifteenth P conductivity type Metal Oxide Semiconductor (PMOS) transistors, respectively.

These second to fifteenth PMOS transistors p2, p3, p6, p8, p9, p10, p11, p14, and p15 incorporated in the memory cell circuit 100 have the following relationship:

The second PMOS transistor p2 corresponds to a third transistor of a first conductivity type;

The third PMOS transistor p3 corresponds to a fourth transistor of the first conductivity type;

The sixth PMOS transistor p6 corresponds to a second transistor of the first conductivity type;

The eighth PMOS transistor p8 corresponds to an eighth transistor of the first conductivity type;

The ninth PMOS transistor p9 corresponds to a seventh transistor of the first conductivity type;

The tenth PMOS transistor p10 corresponds to a sixth transistor of the first conductivity type;

The eleventh PMOS transistor p11 corresponds to a ninth transistor of the first conductivity type;

The fourteenth PMOS transistor p14 corresponds to a fifth transistor of the first conductivity type; and The fifteenth PMOS transistor p15 corresponds to a first transistor of the first conductivity type.

Configuration of the first memory circuit 1

Next, the configuration of the first memory circuit 1 incorporated in the memory cell circuit 100 will be explained in detail.

The first memory circuit 1 comprises the first inverter 7 and the second inverter 8 connected in parallel reversely. A data item stored in the first memory circuit 1 is read out through the output terminal 7a of the first inverter 7 to outside. The first inverter 7 comprises the fifteenth PMOS transistor p15 and the fifteenth NMOS transistor n15. The second inverter 8 comprises the sixth PMOS transistor p6 and the sixth NMOS transistor n6. The gate, the source, and the drain of the fifteenth PMOS transistor p15 are connected to the output terminal 8a of the second inverter 8, the power source line 5, and the output terminal 7a of the first inverter 7, respectively.

The gate, the source, and the drain of the fifteenth NMOS transistor n15 are connected to the output terminal 8a of the second inverter 8, the ground line 6, and the output terminal 7a of the first inverter 7, respectively.

The gate, the source, and the drain of the sixth PMOS transistor p6 are connected to the output terminal 7a of the first inverter 7, the power source line 5, and the output terminal 8a of the second inverter 8, respectively.

The gate, the source, and the drain of the sixth NMOS transistor n6 are connected to the output terminal 7a of the first inverter 7, the ground line 6, and the output terminal 8a of the second inverter 8, respectively.

Configuration of the second memory circuit 2

Next, the configuration of the second memory circuit 2 incorporated in the memory cell circuit 100 will be explained in detail.

The second memory circuit 2 comprises the third inverter 9 and the fourth inverter 10 connected in parallel reversely. A data item stored in the second memory circuit 2 is read out through the output terminal 9a of the third inverter 9 to outside. The third inverter 10 comprises the second PMOS transistor p2 and the second NMOS transistor n2. The fourth inverter 10 comprises the third PMOS transistor p3 and the third NMOS transistor n3. The gate, the source, and the drain of the second PMOS transistor p2 are connected to the output terminal 10a of the fourth inverter 10, the power source line 5, and the output terminal 9a of the third inverter 9, respectively.

The gate, the source, and the drain of the second NMOS transistor n2 are connected to the output terminal 10a of the fourth inverter 10, the ground line 6, and the output terminal 9a of the third inverter 9, respectively.

The gate, the source, and the drain of the third PMOS transistor p3 are connected to the output terminal 9a of the third inverter 9, the power source line 5, and the output terminal 10a of the fourth inverter 4, respectively.

The gate, the source, and the drain of the third NMOS transistor n3 are connected to the output terminal 9a of the third inverter 9, the ground line 6, and the output terminal 10a of the fourth inverter 4, respectively.

Furthermore, the drain, the source, and the gate of the sixteenth NMOS transistor n16 are connected to the output terminal 7a of the first inverter 7, the second write-in bit line W0BLC, and the first write-in word line W0WL0, respectively.

The drain, the source, and the gate of the fifth NMOS transistor n5 are connected to the output terminal 8a of the second inverter 8, the first write-in bit line W0BL, and the first write-in word line W0WL0, respectively.

The drain, the source, and the gate of the first NMOS transistor n1 are connected to the output terminal 9a of the third inverter 9, the second write-in bit line W0BLC, and the second write-in word line W0WL1, respectively.

The drain, the source, and the gate of the fourth NMOS transistor n4 are connected to the output terminal 10a of the fourth inverter 10, the first write-in bit line W0BL, and the second write-in word line W0WL1, respectively.

In addition, the read-out circuit 4 comprises the complex logical circuit 11, the fourteenth PMOS transistor p14, the eleventh NMOS transistor nil, the twelfth NMOS transistor n12, the fourteenth NMOS transistor n14, and the thirteenth NMOS transistor n13.

The first output terminal 11a, the second input terminal 11b, the third input terminal 11c, and the fourth input terminal 11d of the complex logical circuit 11 are connected to the second memory circuit 2, the second readout word line R1WL1, the first memory circuit 1, and the first read-out word line R1WL0, respectively.

The source, the gate, and the drain of the fourteenth NMOS transistor n14 are connected to the power source line 5, the output terminal 11e of the complex logical circuit 11, and the read-out bit line R1BL, respectively.

The source, the gate, and the drain of the eleventh NMOS transistor n11 are connected to the ground line 6, the output terminal 11e of the complex logical circuit 11, and the source of the twelfth NMOS transistor n12, respectively.

The source, the gate, and the drain of the twelfth NMOS transistor n12 are connected to the drain of the eleventh NMOS transistor n11, the first read-out word line R1WL0, and the read-out bit line R1BL, respectively.

The source, the gate, and the drain of the fourteenth NMOS transistor n14 are connected to the ground line 6, the output terminal 11e of the complex logical circuit 11, and the source of the thirteenth NMOS transistor n13, respectively.

The source, the gate, and the drain of the thirteenth NMOS transistor n13 are connected to the drain of the fourteenth NMOS transistor n14, the second read-out word line R1WL1, and the read-out bit line R1BL, respectively.

Configuration of the complex logical circuit 11

Next, the configuration of the complex logical circuit 11 incorporated in the memory cell circuit 100 will be explained ind detail.

The complex logical circuit 11 comprises the eighth to eleventh PMOS transistors p8 to p11 and the seventh to tenth NMOS transistors n7 to n10.

The drain, the gate, and the source of the tenth PMOS transistor p10 are connected to the output terminal 11e of the complex logical circuit 11, the fourth input terminal 11d of the complex logical circuit 11, and the source of the ninth PMOS transistor p9, respectively.

The drain, the gate, and the source of the ninth PMOS transistor p9 are connected to the output terminal 11e of the complex logical circuit 11, the third input terminal 11c of the complex logical circuit 11, and the source of the tenth PMOS transistor p10, respectively.

The drain, the gate, and the source of the eighth PMOS transistor p8 are connected to the source of the tenth PMOS transistor p10, the first input terminal 11a of the complex logical circuit 11, and the power source line 5, respectively.

The drain, the gate, and the source of the eleventh PMOS transistor p11 are connected to the source of the ninth PMOS transistor p9, the second input terminal 11b of the complex logical circuit 11, and the power source line 5, respectively.

The source, the gate, and the drain of the tenth NMOS transistor n10 are connected to the ground line 6, the fourth input terminal 11d of the complex logical circuit 11, and the drain of the ninth NMOS transistor n9, respectively.

The drain, the gate, and the source of the ninth NMOS transistor n9 are connected to the drain of the tenth NMOS transistor n10, the third input terminal 11c of the complex logical circuit 11, and the output terminal 11e of the complex logical circuit 11, respectively.

The source, the gate, and the drain of the eighth NMOS transistor n8 are connected to the drain of the seventh NMOS transistor n7, the first input terminal 11a of the complex logical circuit 11, and the output terminal 11e of the complex logical circuit 11, respectively.

The drain, the gate, and the source of the seventh NMOS transistor n7 are connected to the source of the eighth NMOS transistor n8, the input terminal 11b of the complex logical circuit 11, and the ground line, respectively.

Layout pattern of the memory cell circuit 100

Next, the layout pattern of the memory cell circuit 100 as the first embodiment will be explained in detail.

Figure 3:
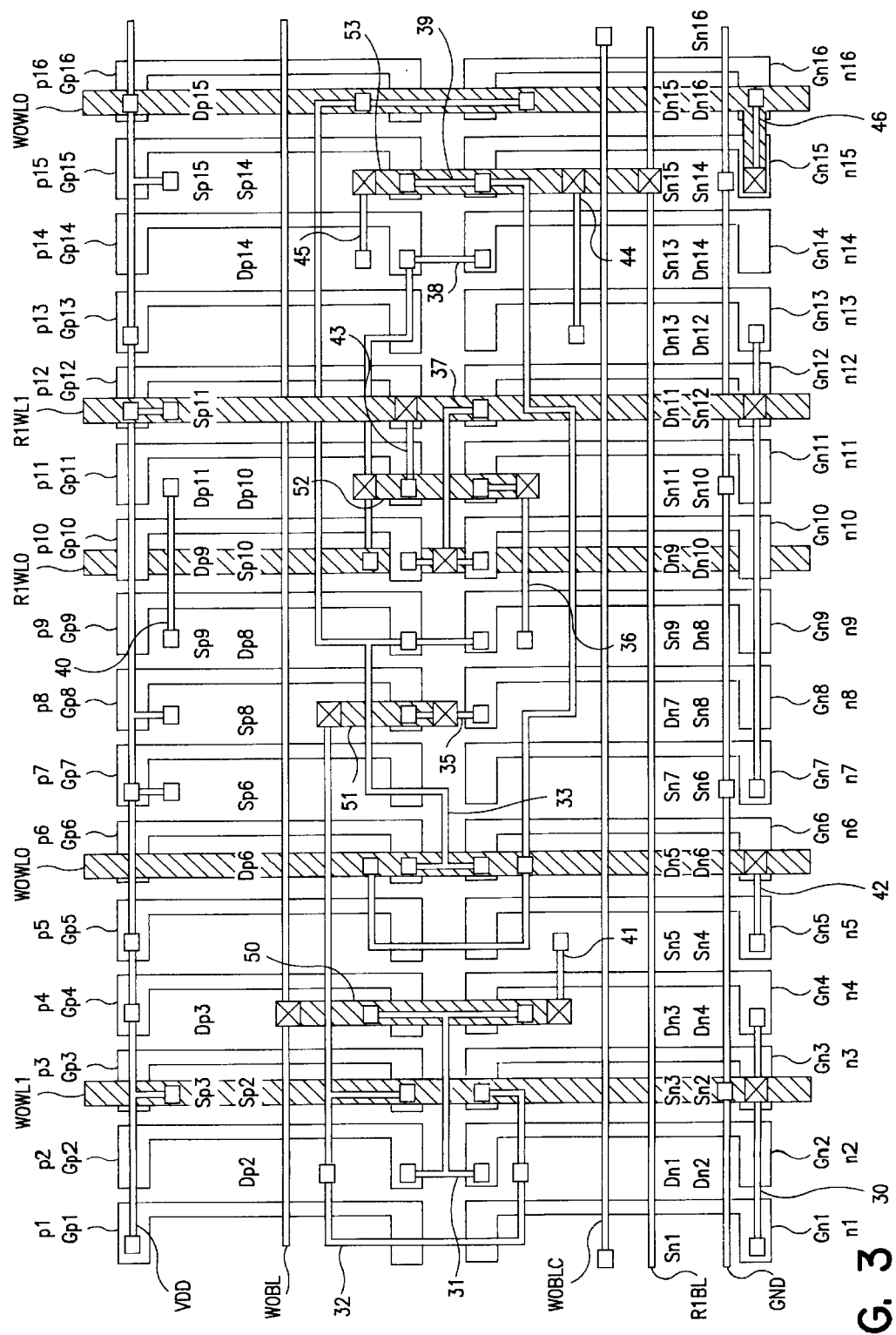
FIG. 3 is a diagram showing a memory cell layout pattern of the memory cell circuit according to the first embodiment of the present invention.

FIG. 3 is a diagram showing the memory cell layout pattern of the memory cell circuit 100 according to the first embodiment of the present invention. In FIG. 3, the reference characters n1 to n16 designate the first to sixteenth NMOS transistors, respectively. In addition, the reference characters p1 to p16 denote the first to sixteenth PMOS transistors, respectively. The reference characters Gn1 to Gn16 indicate gate regions of the first to sixteenth NMOS transistors n1 to n16, respectively. The reference characters Sn1 to Sn16 designate source regions of the first to sixteenth NMOS transistors n1 to n16, respectively. The reference characters Dn1 to Dn16 indicate drain regions of the first to sixteenth NMOS transistors n1 to n16, respectively.

Furthermore, the reference characters Gp1 to Gp16 designate gate regions of the first to sixteenth NMOS transistors n1 to n16, respectively.

The reference characters Sp2, Sp3, Sp6, Sp8, Sp9, Sp10, Sp11, Sp14, and Sp15 designate the source regions of the second, third, sixth, eighth, ninth, tenth, eleventh, fourteenth, and the fifteenth PMOS transistors p2, p3, p6, p8, p9, p10, p11, p14, and p15, respectively.

The reference characters Dp2, Dp3, Dp6, Dp8, Dp9, Dp10, Dp11, Dp14, and Dp15 denote the drain regions of the second, third, sixth, eighth, ninth, tenth, eleventh, fourteenth, and fifteenth PMOS transistors p2, p3, p6, p8, p9, p10, p11, p14, and p15, respectively.

The reference characters W0BL designates the first write-in bit line made up of the first layer wiring. The reference character W0BLC denotes the second write-in bit line made up of the first layer wiring. The reference character W0WL0 indicates the first write-in word line made up of the second layer wiring. The reference character W0WL1 designates the second write-in word line made up of the second layer wiring. The reference character R1WL0 indicates the first reqd-out word line made up of the second layer wiring. The reference character R1WL1 denotes the second read-out word line made up of the second layer wiring. The reference character R1BL indicate the read-out bit line made up of the first layer wiring. The reference character VDD designates the power source line made up of the first layer wiring. The reference character GND indicates the ground line made up of the first layer wiring. In addition, the reference numbers 30 to 46 designate the first layer wiring lines other than the first and second write-in bit lines W0BL and W0BLC, the read-out bit lines R1BL, the power source line VDD, and the ground line GND. The reference numbers 50 to 53 indicate the second layer wiring lines other than the first and second write-in word lines W0WL0 and W0WL1, and the first and second read-out word lines R1WL0 and R1WL1.

The first layer wirings are formed on the NMOS transistors and the PMOS transistors. The second layer wirings are formed on the first layer wirings.

In FIG. 3, the first layer wiring is shown by using solid lines and the second layer wiring by using hatching lines. In addition, in FIG. 3, open quadrilaterals indicate contact holes through which the first layer wiring is electrically connected to the gate regions (or gate electrodes), the source regions, and the drain regions, and quadrilaterals including a symbol "X" denotes bi-holes through which the first layer wirings and the second layer wirings are connected electrically.

As shown in FIG. 3, in the memory cell layout pattern of the memory cell circuit 100 as the first embodiment of the present invention, a row direction is a direction of the transistor array and a direction on which the transistor arrays are adjacent to each other is a column direction. The rows are labeled by using the first row, the second row, . . . , and the n-th row in order observed from the lower section in FIG. 3. The columns are labeled by using the first column, the second column, . . . , the sixteenth column in order observed from the left side of FIG. 3. In this case, a first transistor array comprising the NMOS transistors is formed in the first row and a second transistor array comprising the PMOS transistors is formed in the second row.

In the first transistor array of the first row, the first to sixteenth NMOS transistors n1 to n16 are formed in the first to sixteenth columns in order.

Furthermore, in the transistor array in the first row shown in FIG. 3, each pair of following two regions is formed in a same region:

A pair of the drain region Dn1 of the first NMOS transistor n1 and the drain region Dn2 of the second NMOS transistor n2;

A pair of the source region Sn2 of the second NMOS transistor n2 and the source region Sn3 of the third NMOS transistor n3;

A pair of the drain region Dn3 of the third NMOS transistor n3 and the drain region Dn4 of the fourth NMOS transistor n4;

A pair of the source region Sn4 of the fourth NMOS transistor n4 and the source region Sn5 of the fifth NMOS transistor n5;

A pair of the drain region Dn5 of the fifth NMOS transistor n5 and the drain region Dn6 of the sixth NMOS transistor n6;

A pair of the source region Sn6 of the sixth NMOS transistor n6 and the source region Sn7 of the seventh NMOS transistor n7;

A pair of the drain region Dn7 of the seventh NMOS transistor n7 and the source region Sn8 of the eighth NMOS transistor n8;

A pair of the drain region Dn8 of the eighth NMOS transistor n8 and the source region Sn9 of the ninth NMOS transistor n9;

A pair of the drain region Dn9 of the ninth NMOS transistor n9 and the drain region Dn10 of the tenth NMOS transistor n10;

A pair of the source region Sn10 of the tenth NMOS transistor n10 and the source region Sn11 of the eleventh NMOS transistor n11;

A pair of the drain region Dn11 of the eleventh NMOS transistor nil and the source region Sn12 of the twelfth NMOS transistor n12;

A pair of the drain region Dn12 of the eleventh NMOS transistor n12 and the drain region Dn13 of the thirteenth NMOS transistor n13;

A pair of the source region Sn13 of the thirteenth NMOS transistor n13 and the drain region Dn14 of the fourteenth NMOS transistor n14;

A pair of the source region Sn14 of the fourteenth NMOS transistor n14 and the source region Sn15 of the fifteenth NMOS transistor n15; and A pair of the drain region Dn15 of the fifteenth NMOS transistor n15 and the drain region Dn16 of the sixteenth NMOS transistor n16.

Both the source region Sn1 of the first NMOS transistor n1 and the source region Sn16 of the sixteenth NMOS transistor N16 are connected to the second write-in bit line W0BLC. Accordingly, it is possible that the source region Sn1 of the first NMOS transistor n1 in one memory cell circuit and the source region Sn16 of the sixteenth NMOS transistor circuit n16 in other memory cell circuit are formed in a same region by increasing the number of columns in each transistor array, when a plurality of memory cell circuits shown in FIG. 1 are fabricated.

In addition, in the transistor array in the second row, the first to sixteenth PMOS transistors p1 to p16 are formed in the first to sixteenth columns, respectively. In each of the first, fourth, fifth, seventh, eleventh, thirteenth, and sixteenth PMOS transistors p1, p4, p5, p7, p12, p13, and p16, the gate is separated.

Furthermore, in the transistor array in the second row, each pair of following two regions is formed in a same region:

A pair of the source region Sp2 of the second PMOS transistor p2 and the source region Sp3 of the third PMOS transistor p2;

A pair of the drain region Dp8 of the eighth PMOS transistor p8 and the source region Sp9 of the ninth PMOS transistor p9;

A pair of the drain region Dp9 of the ninth PMOS transistor p9 and the source region Sp10 of the tenth PMOS transistor p10;

A pair of the drain region Dp10 of the tenth PMOS transistor p10 and the drain region Dp11 of the eleventh PMOS transistor p11; and A pair of the source region Sp14 of the fourteenth PMOS transistor p14 and the source region Sp15 of the fifteenth PMOS transistor p15.

The first write-in bit line W0BL is fabricated on transistor in the second row and connected to the source region Sn4 (the source region Sn5 of the fifth NMOS transistor n5) of the fourth NMOS transistor n4 through the second layer wiring 50 and the first layer wiring 41.

The second write-in bit line W0BLC is fabricated on the transistors in the first row and connected to the source region Sn1 of the first NMOS transistor n1 and the source region Sn16 of the sixteenth NMOS transistor n16.

The read-out bit line R1BL is placed on the transistors in the first row and connected to the drain region Dn12 of the twelfth NMOS transistor n12 (the drain region Dn13 in the thirteenth NMOS transistor n13) through the second layer wiring 53 and the first layer wiring 44 and further connected to the drain region of the fourteenth PMOS transistor p14 through the second layer wiring 53 and the first layer wiring 45.

Furthermore, the power source wiring VDD is placed on the transistors in the second row, and connected to the gate electrodes Gp1, Gp4, Gp5, Gp7, Gp12, Gp13, and Gp16 of the first, fourth, fifth, seventh, twelfth, thirteenth, and sixteenth PMOS transistors p1, p4, p5, p7, p12, p13, and p16. Moreover, the power source wiring VDD is also connected to the source region Sp2 of the second PMOS transistor p2 (the source region Sp3 of the third PMOS transistor p3), the source regions Sp6, Sp8, and Sp11 of the sixth, eighth, and eleventh PMOS transistors p6, p8, and p11, and the source region Sp14 of the fourteenth PMOS transistor p14 (the source region Sp15 of the fifteenth PMOS transistor p15).

The ground wiring is placed on the transistors in the first row and connected to the source region Sn2 of the second NMOS transistor n2 (the source region Sn3 of the third NMOS transistor n3), the source region Sn6 of the sixth NMOS transistor n6 (the source region Sn7 of the seventh NMOS transistor n7), the source region Sn10 of the tenth NMOS transistor n10 (the source region Sn11 of the eleventh NMOS transistor n11), and the source region Sn14 of the fourteenth NMOS transistor n14 (the source region Sn15 of the fifteenth NMOS transistor n15).

The first write-in word line W0WL0 is placed on the transistors in the sixth column and the sixteenth column. The first write-in word line W0WL0 placed on the transistors in the sixth column is connected to the gate electrode Gn5 of the fifth NMOS transistor n5 through the first layer wiring 42, and the first write-in word line W0WL0 placed on the transistors in the sixteenth column is connected to the gate electrode Gn16 of the sixteenth NMOS transistor n16 through the first layer wiring 46.

In addition, the second write-in word line W0WL1 is placed on the transistors in the third column and the sixteenth column and connected to the gate electrode Gn1 of the first NMOS transistor n1 and the gate electrode Gn4 of the fourth NMOS transistor n4 through the first layer wiring 30, respectively.

The first read-out word line R1WL0 is placed on the transistors in the tenth column and connected to the gate electrode Gn10 of the tenth NMOS transistor n10, the gate electrode Gn12 of the twelfth NMOS transistor n12, and the gate electrode Gp10 of the tenth PMOS transistor p10 through the first layer wiring 37.

The second read-out word line R1WL1 is placed on the transistors in the twelfth column and connected to the gate electrode Gn7 of the seventh NMOS transistor n7 and the gate electrode Gn13 of the thirteenth NMOS transistor n13 through the first layer wiring 34, and also connected to the gate electrode Gp11 of the twelfth PMOS transistor p11 through the first layer wiring 43.

Specifically, the first layer wiring 30 connects the gate electrode Gn1 of the first NMOS transistor n1 with the gate electrode Gn4 of the fourth NMOS transistor n4.

The gate electrodes Gn2 and Gp2 of the second NMOS transistor n2 and the second PMOS transistor p2 and the drain region Dn3 of the third NMOS transistor (the drain region Dn4 of the fourth NMOS transistor n4) and the drain region Dp3 of the third PMOS transistor Dp3 are connected through the first layer wiring 31.

Through the first layer wiring 32, the gate electrode Gn3 of the third NMOS transistor n3, the drain region Dn1 of the first NMOS transistor n1 (the drain region Dn2 of the second NMOS transistor n2), the drain region Dp2 of the second PMOS transistor p2, and the gate electrode Gp3 of the third PMOS transistor p3 are connected.

Through the first layer wiring 33, the gate electrode Gn6 of the sixth NMOS transistor n6, the gate electrode Gp6 of the sixth PMOS transistor p6, the gate electrode Gn9 of the ninth NMOS transistor n9, the gate electrode Gp9 of the ninth PMOS transistor p9, the drain region Dn15 of the fifteenth NMOS transistor n15 (the drain region Dn16 of the sixteenth NMOS transistor n16), and the drain region Dp15 of the fifteenth PMOS transistor p15 are connected.

The first layer wiring 34 connects the gate electrode Gn7 of the seventh NMOS transistor n7 to the gate electrode Gn13 of the thirteenth NMOS transistor n13.

The first layer wiring 35 connects the gate electrode Gn8 of the eighth NMOS transistor n8 to the gate electrode Gp8 of the eighth PMOS transistor p8.

The first layer wiring 36 connects the drain region Dn8 of the eighth NMOS transistor n8 (the source region Sn9 of the ninth NMOS transistor n9) to the gate electrode Gn11 of the eleventh NMOS transistor n11.

In addition, through the first layer wiring 37, the gate electrode Gn10 of the tenth NMOS transistor n10, the gate electrode Gp10 of the tenth PMOS transistor p10, and the gate electrode Gn12 of the twelfth NMOS transistor n12 are connected.

Through the first layer wiring 38, the gate electrode Gn14 of the fourteenth NMOS transistor n14, the gate electrode Gp14 of the fourteenth PMOS transistor p14, and the drain region Dp9 of the ninth PMOS transistor p9 (the source region Sp10 of the tenth PMOS transistor p10) are connected.

Furthermore, through the first layer wiring 39, the gate electrode Gn15 of the fifteenth NMOS transistor n15, the gate electrode Gp15 of the fifteenth PMOS transistor p15, the drain region Dn5 of the fifth NMOS transistor n5 (the drain region Dn6 of the sixth NMOS transistor n6), and the drain region Dp6 of the sixth PMOS transistor p6 are connected.

Through the first layer wiring 40, the drain region Dp8 of the eighth PMOS transistor p8 (the source region Sp9 of the ninth PMOS transistor p9) and the drain region Dn10 of the tenth PMOS transistor p10 (the drain region Dp11 of the eleventh PMOS transistor p11) are connected.

Moreover, the second layer wiring 50 placed on the transistors in the fourth column connects the first write-in bit line W0BL to the first layer wiring 41.

The second layer wiring 51 placed on the transistors in the eighth column connects the first layer wiring 32 to the first layer wiring 35.

The second layer wiring 52 placed on the transistors in the eleventh column connects the first layer wiring 36 to the first layer wiring 38.

In addition, through the second layer wiring 53 placed on the transistors in the fifteenth column connects, the first read-out bit line R1BL, the first layer wiring 44, and the first layer wiring 46 are connected.

Next, a description will now be given of the operation of the memory cell circuit 100 shown in FIGS. 1 and 2 having the memory cell layout pattern shown in FIG. 3 according to the first embodiment.

Data write-in operation

First, the operation of data write-in to the memory cell circuit 100 shown in FIG. 1 will be explained.

When data are written into the memory cell circuit 100, a write-in driver (omitted from the drawings) drives so that the level of the first write-in bit line W0BL or the second write-in bit line W0BLC becomes the low level or the high level according to the data to be written. In this case, the driver drives so that both the level of the first write-in bit lines W0BL and W0BLC have the complementary voltage potential level to each other.

When a data item is written into the first memory circuit 1, the level of the first write-in word line W0WL0 becomes the high level. Then, both the fifth and sixteenth NMOS transistors n5 and n16 become active. Because it is prevented that the levels of a plurality of the write-in word lines become the high level simultaneously during the data writing operation, the level of the second write-in word line W0WL1 is set to the low level, so that both the first and fourth NMOS transistors n1 and n4 become inactive. Thereby, the first memory circuit 1 and both the first and second write-in bit lines W0BL and W0BLC are electrically connected, so that the data item is written into the first memory circuit 1. Thus, the data write-in operation to the first memory circuit 1 is completed.

After the completion of the data write-in operation, when the level of the first write-in word line W0WL0 becomes the low level, both the fifth and sixteenth NMOS transistors n5 and n16 become inactive. Thereby, the first memory circuit 1 is not connected to the both the first and second write-in bit lines W0BL and W0BLC electrically. After this state, even if both the levels of the first and second write-in bit lines W0BL and W0BLC are changed, the data item stored in the first memory circuit 1 is not changed, namely the store data item may be kept. Similarly, when a data item is written into the second memory circuit 2, it is required that the level of the second write-in word line W0WL1 is changed to the high level.

Operation of the complex logical circuit 11

Next, the operation of the complex logical circuit 11 incorporated in the memory cell circuit 100 will be explained.

When the data item of the high level is supplied to both the third and fourth input terminals 11c and 11d, both the ninth and tenth PMOS transistors p9 and p10 become inactive and both the ninth and tenth NMOS transistors n9 and n10 become active. Thereby, even if any data item is provided to both the first and second input terminals 11a and 11b, the complex logical circuit 11 outputs the data of the low level.

Similarly, when the data item of the high level is supplied to both the first and second input terminals 11a and 11b, the eighth and eleventh PMOS transistors p8 and p1 become inactive, and the seventh and eighth NMOS transistors n7 and n8 become active. Thereby, even if any data item is given to both the third and fourth input terminals 11c and 11d, the complex logical circuit 11 outputs the data of the low level.

On the other hand, when the data item of the low level is supplied to one of the first and second input terminals 11a and 11b and when the data item of the low level is supplied to one of the third and fourth input terminals 11c and 11d, one of the ninth and tenth PMOS transistors p9 and p10 becomes active, one of the ninth and tenth NMOS transistors n9 and n10 becomes inactive, one of the eighth and eleventh PMOS transistors p8 and p11 becomes active, and one of the seventh and eighth NMOS transistors n7 and n8 becomes inactive. Thereby, the complex logical circuit 11 outputs data of the high level.

Data read-out operation

Next, the data read-out operation from the memory circuit 100 shown in FIG. 1 will be explained.

When a data item stored in the first memory circuit 1 is read out, the level of the first read-out word line R1WL0 is the high level. Because it is prevented that the levels of a plurality of read-out word lines become the high level simultaneously when the data item stored in the first memory circuit 1 is read out, the second read-out word line R1WL1 becomes the low level. Accordingly, the tenth and twelfth NMOS transistors n10 and n12 and the eleventh PMOS transistor p11 become active, and the seventh and thirteenth NMOS transistors n7 and n13 and the tenth PMOS transistor p10 become inactive.

Thereby, even if any data item is given to the first input terminal 11a, the complex logical circuit 11 outputs the data of the low level when the high level is supplied to the fourth input terminal 11d because the ninth NMOS transistor n9 becomes active, and the complex logical circuit 11 outputs the data of the high level when a data item of the low level is supplied to the fourth input terminal 11d because the ninth PMOS transistor p9 becomes active.

When the complex logical circuit 11 outputs data of the high level, the eleventh NMOS transistor n11 becomes active, the data of the low level is output on the readout bit line R1BL. When the complex logical circuit 11 outputs data of the low level, the fourteenth PMOS transistor p14 becomes active, the data of the high level is output on the read-out bit line R1BL.

Since the read-out bit line R1BL is connected to a sense amplifier (omitted from the drawings), the data item that has been read out is transferred to circuits in following stage. Thereby, the data read-out operation from the first memory circuit 1 is completed.

Similarly, the level of the second read-out word line R1WL1 is set to the high level when a data item stored in the second memory circuit 2.

As described above, according to the memory cell circuit 100 having the layout pattern shown in FIG. 3, in order to form the memory cell circuit 100 shown in FIG. 1, a basic cell comprising a pair of the NMOS transistor and the PMOS transistor is arranged in row direction and the sixteen basic cells are arranged in column direction. It is thereby possible to form memory cells, each cell having a small aspect ratio.

In addition, according to the memory cell circuit 100 of the first embodiment, the eight basic cells are required to form one memory means. Because this configuration is the same as that of the conventional memory means, the integrated rate of the memory cell array may be equal to that of the conventional memory cell array.

Second embodiment

Figure 4:
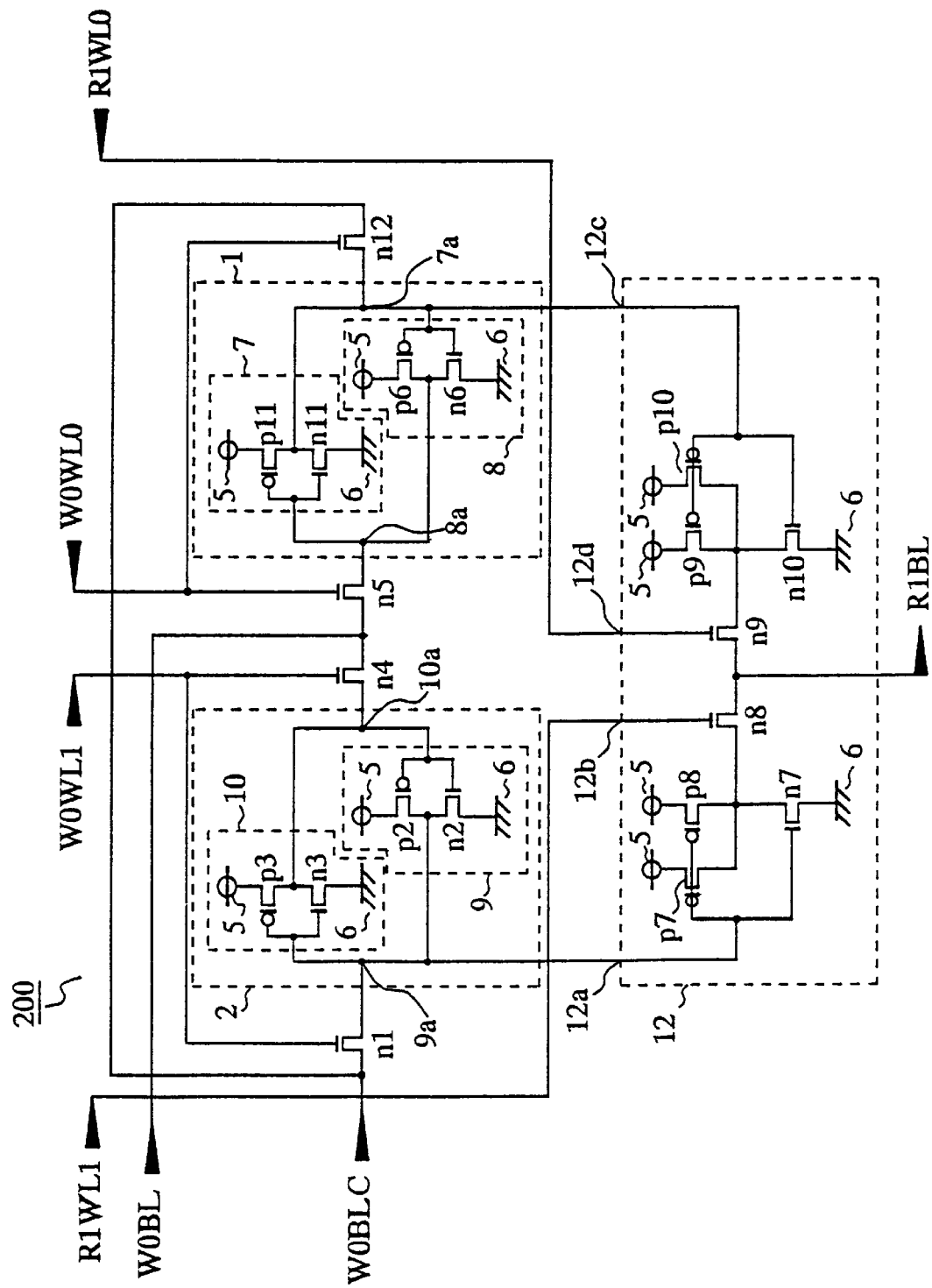
FIG. 4 is a diagram showing a configuration of a memory cell circuit according to a second embodiment of the present invention.

FIG. 4 is a diagram showing a configuration of a memory cell circuit 200 according to the second embodiment of the present invention.

Configuration of the memory cell circuit 200

At first, the configuration of the memory cell circuit 200 will be explained in detail.

In FIG. 4, the reference number 12 designates a readout circuit, 12a indicates a first input terminal of the read-out circuit 12, 12b denotes a second input terminal of the read-out circuit 12, 12c designates a third input terminal of the read-out circuit 12, and 12d designates a fourth input terminal of the read-out circuit 12.

In addition, the reference characters n1 to n12 designate first to eleventh N conductivity type Metal Oxide Semiconductor (NMOS) transistors, respectively. These first to eleventh NMOS transistors n1 to n12 incorporated in the memory cell circuit 200 have the following relationship:

The first NMOS transistor n1 corresponds to a third transistor of a second conductivity type;

The second NMOS transistor n2 corresponds to a seventh transistor of the second conductivity type;

The third NMOS transistor n3 corresponds to an eighth transistor of the second conductivity type;

The fourth NMOS transistor n4 corresponds to a fourth transistor of the second conductivity type;

The fifth NMOS transistor n5 corresponds to a second transistor of the second conductivity type;

The sixth NMOS transistor n6 corresponds to a sixth transistor of the second conductivity type;

The seventh NMOS transistor n7 corresponds to a tenth transistor of the second conductivity type;

The eighth NMOS transistor n8 corresponds to a ninth transistor of the second conductivity type;

The ninth NMOS transistor n9 corresponds to an eleventh transistor of the second conductivity type;

The tenth NMOS transistor n10 corresponds to a twelfth transistor of the second conductivity type;

The eleventh NMOS transistor n11 corresponds to a fifth transistor of the second conductivity type; and The twelfth NMOS transistor n12 corresponds to a first transistor of the second conductivity type.

The reference characters p2, p3, p6, p7, p8, p9, p10, and p11 indicate second, third, sixth, seventh, eighth, ninth, tenth, and eleventh P conductivity type Metal Oxide Semiconductor (PMOS) transistors, respectively.

These second to eleventh PMOS transistors p2, p3, p6, p7, p8, p9, p10, and p11 incorporated in the memory cell circuit 200 have the following relationship:

The second PMOS transistor p2 corresponds to a third transistor of a first conductivity type;

The third PMOS transistor p3 corresponds to a fourth transistor of the first conductivity type;

The sixth PMOS transistor p6 corresponds to a second transistor of the first conductivity type;

The seventh PMOS transistor p7 corresponds to a fifth transistor of the first conductivity type;

The eighth PMOS transistor p8 corresponds to a sixth transistor of the first conductivity type;

The ninth PMOS transistor p9 corresponds to a seventh transistor of the first conductivity type;

The tenth PMOS transistor p10 corresponds to an eighth transistor of the first conductivity type; and The eleventh PMOS transistor p11 corresponds to a first transistor of the first conductivity type.

Other components of the memory cell circuit 200 as the second embodiment are the same as those of the memory cell circuit 100 as the first embodiment, therefore, the explanation of the same components is omitted here for brevity. Those same components will be referenced with the same reference numbers.

Configuration of the first memory circuit 1

Next, the configuration of the first memory circuit 1 incorporated in the memory cell circuit 200 of the second embodiment will be explained in detail.

The first memory circuit 1 in the memory cell circuit 200 comprises the first inverter 7 and the second inverter 8 connected in parallel reversely. A data item stored in the first memory circuit 1 is read out through the output terminal 7a of the first inverter 7 to outside.

The first inverter 7 comprises the eleventh PMOS transistor p11 and the eleventh NMOS transistor n11. The second inverter 8 comprises the sixth PMOS transistor p6 and the sixth NMOS transistor n6. The gate, the source, and the drain of the eleventh PMOS transistor p11 are connected to the output terminal 8a of the second inverter 8, the power source line 5, and the output terminal 7a of the first inverter 7, respectively.

The gate, the source, and the drain of the eleventh NMOS transistor n11 are connected to the output terminal 8a of the second inverter 8, the ground line 6, and the output terminal 7a of the first inverter 7, respectively.

The gate, the source, and the drain of the sixth PMOS transistor p6 are connected to the output terminal 7a of the first inverter 7, the power source line 5, and the output terminal 8a of the second inverter 8, respectively.

In addition, the gate, the source, and the drain of the sixth NMOS transistor n6 are connected to the output terminal 7a of the first inverter 7, the ground line 6, and the output terminal 8a of the second inverter 8, respectively.

Configuration of the second memory circuit 2

Next, the configuration of the second memory circuit 2 incorporated in the memory cell circuit 200 will be explained in detail.

The second memory circuit 2 comprises the third inverter 9 and the fourth inverter 10 connected in parallel reversely.

A data item stored in the second memory circuit 2 is read out through the output terminal 9a of the third inverter 9 to outside.

The third inverter 9 comprises the second PMOS transistor p2 and the second NMOS transistor n2. The fourth inverter 10 comprises the third PMOS transistor p3 and the third NMOS transistor n3.

The gate, the source, and the drain of the second PMOS transistor p2 are connected to the output terminal 10a of the fourth inverter 10, the power source line 5, and the output terminal 9a of the third inverter 9, respectively.

The gate, the source, and the drain of the second NMOS transistor n2 are connected to the output terminal 10a of the fourth inverter 10, the ground line 6, and the output terminal 9a of the third inverter 9, respectively.

The gate, the source, and the drain of the thirteen PMOS transistor p3 are connected to the output terminal 9a of the third inverter 9, the power source line 5, and the output terminal 10a of the fourth inverter 4, respectively.

The gate, the source, and the drain of the third NMOS transistor n3 are connected to the output terminal 9a of the third inverter 9, the ground line 6, and the output terminal 10a of the fourth inverter 4, respectively.

Furthermore, the drain, the source, and the gate of the eleventh NMOS transistor n12 are connected to the output terminal 7a of the first inverter 7, the second write-in bit line W0BLC, and the first write-in word line W0WL0, respectively.

The drain, the source, and the gate of the fifth NMOS transistor n5 are connected to the output terminal 8a of the second inverter 8, the first write-in bit line W0BL, and the first write-in word line W0WL0, respectively.

The drain, the source, and the gate of the first NMOS transistor n1 are connected to the output terminal 9a of the third inverter 9, the second write-in bit line W0BLC, and the second write-in word line W0WL1, respectively.

The drain, the source, and the gate of the fourth NMOS transistor n4 are connected to the output terminal 10a of the fourth inverter 10, the first write-in bit line W0BL, and the second write-in word line W0WL1, respectively.

In addition, the read-out circuit 4 comprises the eighth NMOS transistor n8, the seventh NMOS transistor n7, the seventh PMOS transistor p7, the eighth PMOS transistor p8, the ninth NMOS transistor n9, the tenth NMOS transistor n10, the ninth PMOS transistor p9, and the tenth PMOS transistor p10.

The first output terminal 12a, the second input terminal 12b, the third input terminal 12c, and the fourth input terminal 12d of the read-out circuit 12 are connected to the second memory circuit 2, the second readout word line R1WL1, the first memory circuit 1, and the first read-out word line R1WL0, respectively.

The drain, the gate, and the source of the eighth NMOS transistor n8 are connected to the read-out bit line R1BL, the input terminal 12b of the read-out circuit 12, and the drains of the seventh NMOS transistor n7, the seventh PMOS transistor p7, and the eighth PMOS transistor p8, respectively.

The drain, the gate, and the source of the seventh NMOS transistor n7 are connected to the source of the eighth NMOS transistor n8, the output terminal 12a of the read-out circuit 12, and the ground line 6, respectively.

The drain, the gate, and the source of the seventh PMOS transistor p7 are connected to the source of the eighth NMOS transistor n8, the first input terminal 12a of the read-out circuit 12, and the power source line 5, respectively.

The drain, the gate, and the source of the eighth PMOS transistor pg are connected to the source of the eighth NMOS transistor n8, the first input terminal 12a of the read-out circuit 12, and the ground line 6, respectively.

The drain, the gate, and the source of the ninth NMOS transistor n9 are connected to the read-out bit line R1BL, the fourth input terminal 12d of the read-out circuit 12, and the drains of the tenth NMOS transistor n10, the ninth PMOS transistor p9, and the tenth PMOS transistor p10, respectively.

The drain, the gate, and the source of the tenth NMOS transistor n10 are connected to the source of the ninth NMOS transistor n9, the third input terminal 12c of the read-out circuit 12, and the ground line 6, respectively.

The drain, the gate, and the source of the ninth PMOS transistor p9 are connected to the source of the ninth NMOS transistor n9, the third input terminal 12c of the read-out circuit 12, and the power source line 5, respectively.

The drain, the gate, and the source of the tenth PMOS transistor p10 are connected to the source of the ninth NMOS transistor n9, the third input terminal 12c of the read-out circuit 12, and the power source line 5, respectively.

Layout pattern of the memory cell circuit 200

Figure 5:
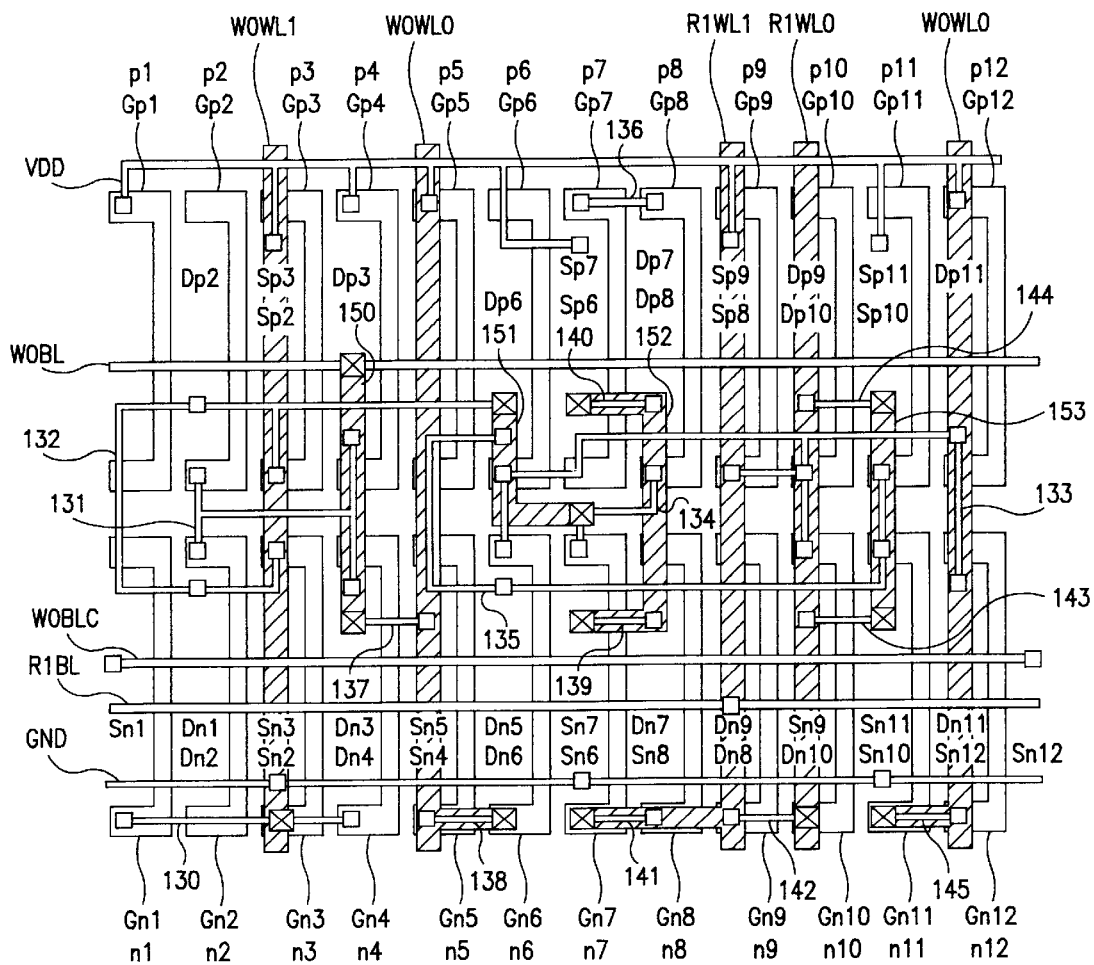
FIG. 5 is a diagram showing a memory cell layout pattern of the memory cell circuit according to the second embodiment of the present invention.
Figure 6:
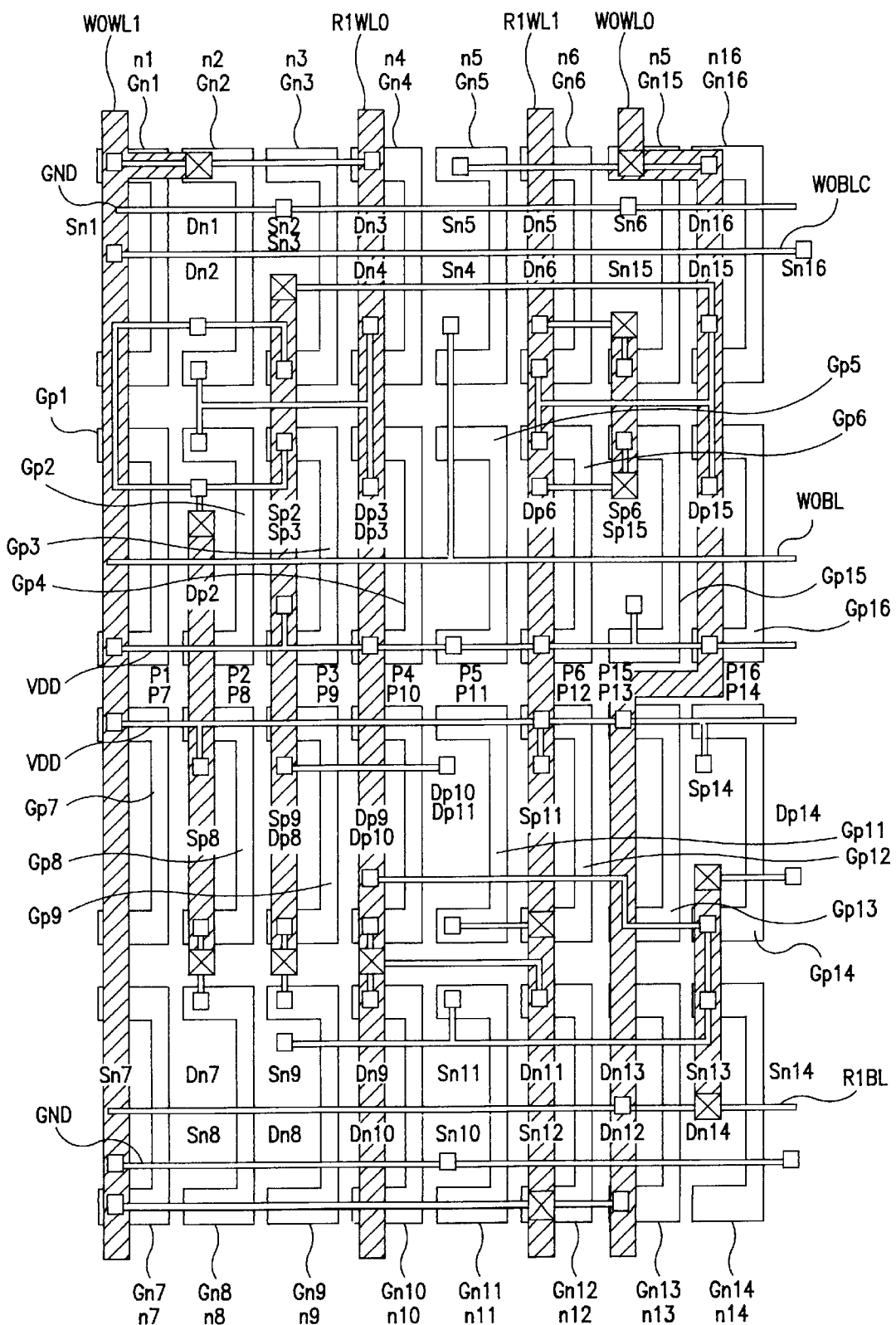
FIG. 6 is a diagram showing a layout pattern of conventional memory cells to form a memory cell circuit.
Figure 7:
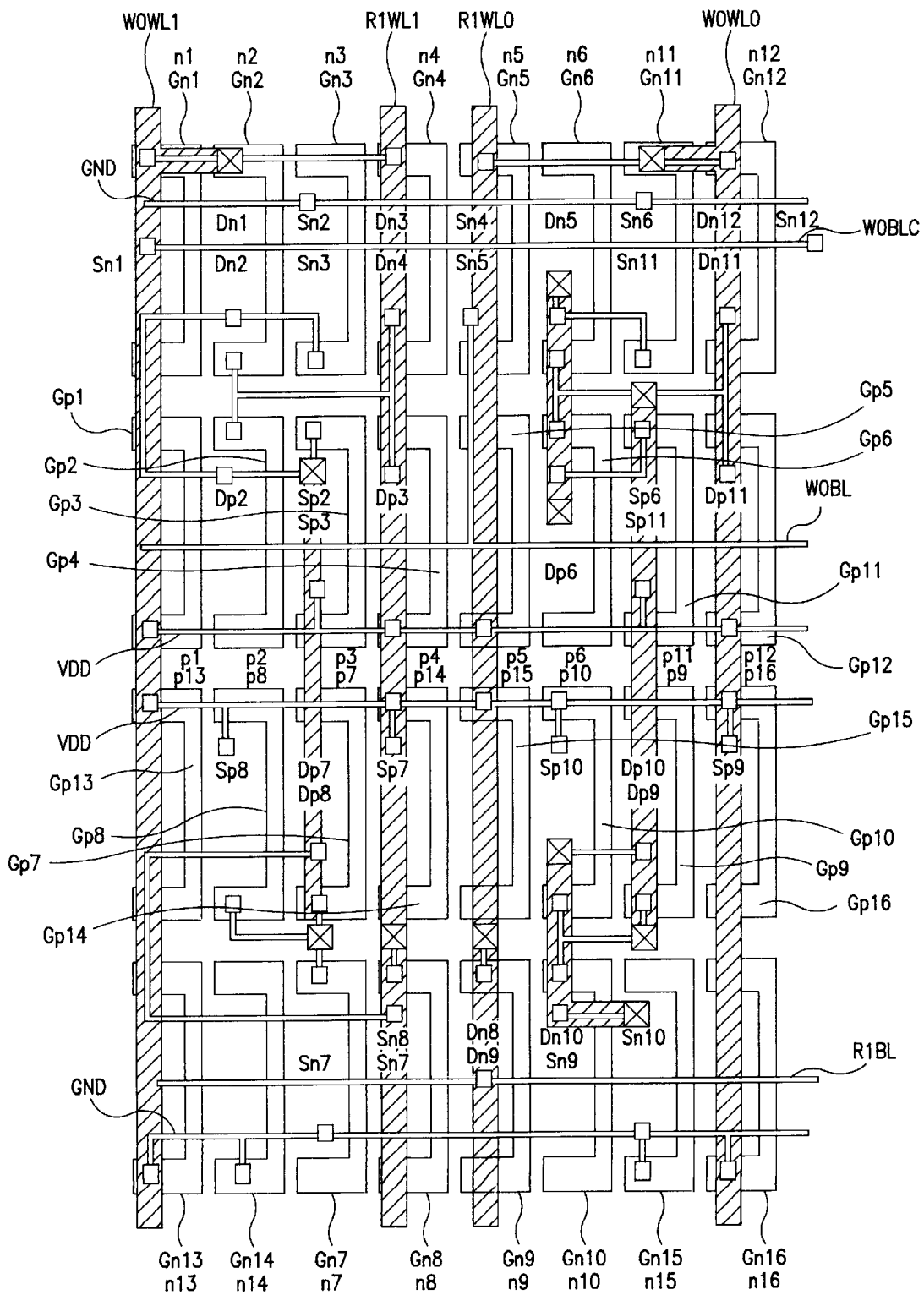
FIG. 7 is a diagram showing another layout pattern of conventional memory cells to form a memory cell circuit.

FIG. 5 is a diagram showing a memory cell layout pattern of the memory cell circuit 200 shown in FIG. 4 according to the second embodiment of the present invention.

In FIG. 5, the reference characters n1 to n12 designate the first to twelfth NMOS transistors, respectively. In addition, the reference characters p1 to p12 denote the first to twelfth PMOS transistors, respectively. The reference characters Gn1 to Gn12 indicate gate regions of the first to twelfth NMOS transistors n1 to n12, respectively. The reference characters Sn1 to Sn12 designate source regions of the first to twelfth NMOS transistors n1 to n12, respectively. The reference characters Dn1 to Dn12 indicate drain regions of the first to twelfth NMOS transistors n1 to n12, respectively.

Furthermore, the reference characters Gp1 to Gp12 designate gate regions of the first to twelfth NMOS transistors n1 to n12, respectively.

The reference characters Sp2, Sp3, Sp6, Sp7, Sp8, Sp9, Sp10, and Sp11 designate the source regions of the second, third, sixth, seventh, eighth, ninth, tenth, and eleventh PMOS transistors p2, p3, p6, p7, p8, p9, p10, and p11, respectively. The reference characters Dp2, Dp3, Dp6, Dp7, Dp8, Dp9, Dp10, and Dp11 denote the drain regions of the second, third, sixth, seventh, eighth, ninth, tenth, and eleventh PMOS transistors p2, p3, p6, p7, p8, p9, p10, and p11, respectively.

The reference characters W0BL designates the first write-in bit line made up of the first layer wiring. The reference character W0BLC denotes the second write-in bit line made up of the first layer wiring. The reference character W0WL0 indicates the first write-in word line made up of the second layer wiring. The reference character W0WL1 designates the second write-in word line made up of the second layer wiring. The reference character R1WL0 indicates the first reqd-out word line made up of the second layer wiring. The reference character R1WL1 denotes the second read-out word line made up of the second layer wiring. The reference character R1BL indicate the read-out bit line made up of the first layer wiring. The reference character VDD designates the power source line made up of the first layer wiring. The reference character GND indicates the ground line made up of the first layer wiring. In addition, the reference numbers 130 to 145 designate the first layer wiring lines other than the first and second write-in bit lines W0BL and W0BLC, the read-out bit lines R1BL, the power source line VDD, and the ground line GND. The reference numbers 150 to 153 indicate the second layer wiring lines other than the first and second write-in word lines W0WL0 and W0WL1, and the first and second read-out word lines R1WL0 and R1WL1.

The first layer wirings are formed on the NMOS transistors and the PMOS transistors. The second layer wirings are formed on the first layer wirings.

In FIG. 5, the first layer wiring is shown by using solid lines and the second layer wiring by using hatching lines. This case is the same as the case of the layout pattern of the memory cell circuit 100 as the first embodiment.

In addition, in FIG. 5, open quadrilaterals indicate contact holes through which the first layer wiring is electrically connected to the gate regions (or gate electrodes), the source regions, and the drain regions, and quadrilaterals including a symbol "X" denotes bi-holes through which the first layer wirings and the second layer wirings are connected electrically.

As shown in FIG. 5, in the memory cell layout pattern of the memory cell circuit 200 as the second embodiment of the present invention, a row direction is a direction of the transistor array and a direction on which the transistor arrays are adjacent to each other is a column direction. The rows are labeled by using the first row, the second row, . . . , and the n-th row in order observed from the lower section in FIG. 5. The columns are labeled by using the first column, the second column, . . . , the sixteenth column in order observed from the left side of FIG. 5. In this case, a first transistor array comprising the NMOS transistors is formed in the first row and a second transistor array comprising the PMOS transistors is formed in the second row.

In the first transistor array of the first row, the first to twelfth NMOS transistors n1 to n12 are formed in the first to twelfth columns in order.

Furthermore, in the transistor array in the first row shown in FIG. 5, each pair of following two regions is formed in a same region:

A pair of the drain region Dn1 of the first NMOS transistor n1 and the drain region Dn2 of the second NMOS transistor n2;

A pair of the source region Sn2 of the second NMOS transistor n2 and the source region Sn3 of the third NMOS transistor n3;

A pair of the drain region Dn3 of the third NMOS transistor n3 and the drain region Dn4 of the fourth NMOS transistor n4;

A pair of the source region Sn4 of the fourth NMOS transistor n4 and the source region Sn5 of the fifth NMOS transistor n5;

A pair of the drain region Dn5 of the fifth NMOS transistor n5 and the drain region Dn6 of the sixth NMOS transistor n6;

A pair of the source region Sn6 of the sixth NMOS transistor n6 and the source region Sn7 of the seventh NMOS transistor n7;

A pair of the drain region Dn7 of the seventh NMOS transistor n7 and the source region Sn8 of the eighth NMOS transistor n8;

A pair of the drain region Dn8 of the eighth NMOS transistor n8 and the drain region Dn9 of the ninth NMOS transistor n9;

A pair of the source region Sn9 of the ninth NMOS transistor n9 and the drain region Dn10 of the tenth NMOS transistor n10;

A pair of the source region Sn10 of the tenth NMOS transistor n10 and the source region Sn11 of the eleventh NMOS transistor n11; and A pair of the drain region Dn11 of the eleventh NMOS transistor n11 and the source region Sn12 of the twelfth NMOS transistor n12.

Through the second write-in bit line W0BLC, the source region Sn1 of the first NMOS transistor n1 and the source region SN12 of the twelfth NMOS transistor are connected. Accordingly, it is possible that the source region Sn1 of the first NMOS transistor n1 in one memory cell circuit and the source region Sn12 of the twelfth NMOS transistor circuit n12 in other memory cell circuit are formed in a same region by increasing the number of columns in each transistor array, when a plurality of memory cell circuits shown in FIG. 4 are fabricated.

In addition, in the transistor array in the second row, the first to twelfth PMOS transistors p1 to p12 are formed in the first to twelfth columns, respectively. In each of the first, fourth, fifth, and eleventh PMOS transistors p1, p4, p5, and p12, the gate is separated.

Furthermore, in the transistor array in the second row, each pair of following two regions is formed in a same region:

A pair of the source region Sp2 of the second PMOS transistor p2 and the source region Sp3 of the third PMOS transistor p2;

A pair of the source region Sp6 of the sixth PMOS transistor p6 and the source region Sp7 of the seventh PMOS transistor p7;

A pair of the drain region Dp7 of the seventh PMOS transistor p7 and the drain region Dp8 of the eighth PMOS transistor p8;

A pair of the source region Sp8 of the eighth PMOS transistor p8 and the source region Sp9 of the ninth PMOS transistor p9;

A pair of the drain region Dp9 of the ninth PMOS transistor p9 and the drain region Dp10 of the tenth PMOS transistor p10; and A pair of the source region Sp10 of the tenth PMOS transistor p10 and the source region Sp11 of the eleventh PMOS transistor p11.

The first write-in bit line W0BL is fabricated on transistor in the second row and connected to the source region Sn4 of the fourth NMOS transistor n4 (the source region Sn5 of the fifth NMOS transistor n5) through the second layer wiring 150 and the first layer wiring 137.

The second write-in bit line W0BLC is fabricated on the transistors in the first row and connected to the source region Sn1 of the first NMOS transistor n1 and the source region Sn12 of the twelfth NMOS transistor n12.

The read-out bit line R1BL is placed on the transistors in the first row and connected to the drain region Dn8 of the eighth NMOS transistor n8 (the drain region Dn9 in the ninth NMOS transistor n9).

Furthermore, the power source wiring VDD is placed on the transistors in the second row, and connected to the gate electrodes Gp1, Gp4, Gp5, and Gp12 of the first, fourth, fifth, and twelfth PMOS transistors p1, p4, p5, and p12. Moreover, the power source wiring VDD is also connected to the source region Sp2 of the second PMOS transistor p2 (the source region Sp3 of the third PMOS transistor p3), the source regions Sp7, Sp8 (the source region Sp9 of the ninth PMOS transistor p9), and Sp10 (the source region Sp11 of the eleventh PMOS transistor p11) of the seventh, eighth, and tenth PMOS transistors p7, p8, and p10.

The ground wiring GND is placed on the transistors in the first row and connected to the source region Sn2 of the second NMOS transistor n2 (the source region Sn3 of the third NMOS transistor n3), the source region Sn6 of the sixth NMOS transistor n6 (the source region Sn7 of the seventh NMOS transistor n7), and the source region Sn10 of the tenth NMOS transistor n10 (the source region Sn11 of the eleventh NMOS transistor nil).

The first write-in word line W0WL0 is placed on the transistors in the fifth column and the twelfth column. The first write-in word line W0WL0 placed on the transistors in the fifth column is connected to the gate electrode Gn5 of the fifth NMOS transistor n5 through the first layer wiring 138, and the first write-in word line W0WL0 placed on the transistors in the twelfth column is connected to the gate electrode Gn12 of the twelfth NMOS transistor n12 through the first layer wiring 145.

In addition, the second write-in word line W0WL1 is placed on the transistors in the third column and connected to the gate electrode Gn1 of the first NMOS transistor n1 and the gate electrode Gn4 of the fourth NMOS transistor n4 through the first layer wiring 30, respectively.

The first read-out word line R1WL0 is placed on the transistors in the tenth column and connected to the gate electrode Gn9 of the ninth NMOS transistor n9 through the first layer wiring 142.

The second read-out word line R1WL1 is placed on the transistors in the ninth column and connected to the gate electrode Gn8 of the eight NMOS transistor n8 through the first layer wiring 141.

Specifically, the first layer wiring 130 connects the gate electrode Gn1 of the first NMOS transistor n1 with the gate electrode Gn4 of the fourth NMOS transistor n4.

The gate electrodes Gn2 and Gp2 of the second NMOS transistor n2 and the second PMOS transistor p2 and the drain region Dn3 of the third NMOS transistor n3 (the drain region Dn4 of the fourth NMOS transistor n4) and the drain region Dp3 of the third PMOS transistor Dp3 are connected through the first layer wiring 31.

Through the first layer wiring 132, the gate electrode Gn3 of the third NMOS transistor n3, the drain region Dn1 of the first NMOS transistor n1 (the drain region Dn2 of the second NMOS transistor n2), the drain region Dp2 of the second PMOS transistor p2, and the gate electrode Gn3 of the third PMOS transistor p3 are connected.

Through the first layer wiring 133, the gate electrode Gn6 of the sixth NMOS transistor n6, the gate electrode Gp6 of the sixth PMOS transistor p6, the drain region Dn11 of the eleventh NMOS transistor n11 (the drain region Dn12 of the twelfth NMOS transistor n12), the drain region Dp11 of the eleventh PMOS transistor p11, the gate electrode Gn10 of the tenth NMOS transistor n10, the gate electrode Gp9 of the ninth PMOS transistor p9, and the gate electrode Gp10 of the tenth PMOS transistor p10 are connected.

In addition, the first layer wiring 134 connects the gate electrode Gn7 of the seventh NMOS transistor n7 to the gate electrode Gp8 of the eighth PMOS transistor p8.

Through the first layer wiring 135, the gate electrode Gn11 of the eleventh NMOS transistor n11, the gate electrode Gp11 of the eleventh PMOS transistor p11, the drain region Dn5 of the fifth NMOS transistor n5 (the drain region Dn6 of the sixth NMOS transistor n6), and the drain region Dp6 of the sixth PMOS transistor p6 are connected.

The first layer wiring 136 connects the gate region Gp7 of the seventh PMOS transistor p7 to the gate electrode Gp8 of the eighth PMOS transistor p8.

In addition, through the second layer wiring 150 placed on the transistors in the fourth column, the first write-in bit line W0BL is connected to the first layer wiring 137.

Through the second layer wiring 151 placed on the transistors in the sixth column, the first layer wiring 132 is connected to the first layer wiring 134.

Through the second layer wiring 152 placed on the transistors in the eighth column, the first layer wiring 139 is connected to the first layer wiring 140.

In addition, through the second layer wiring 152 placed on the transistors in the eleventh column, the first layer wiring 143 is connected to the first layer wiring 144.

Next, a description will now be given of the operation of the memory cell circuit 200 shown in FIG. 4 having the memory cell layout pattern shown in FIG. 5 according to the second embodiment.

Data write-in operation

First, the operation of data write-in to the memory cell circuit 200 shown in FIG. 4 will be explained.

When data are written into the memory cell circuit 200, a write-in driver (omitted from the drawings) drives so that the level of the first write-in bit line W0BL or the second write-in bit line W0BLC becomes the low level or the high level according to the data to be written. In this case, the driver drives so that both the level of the first write-in bit lines W0BL and W0BLC have the complementary voltage potential level to each other.

When a data item is written into the first memory circuit 1, the level of the first write-in word line W0WL0 becomes the high level. Then, both the fifth and twelfth NMOS transistors n5 and n12 become active. Because it is prevented that the levels of a plurality of the write-in word lines become the high level simultaneously during the data writing operation, the level of the second write-in word line W0WL1 is set to the low level, so that both the first and fourth NMOS transistors n1 and n4 become inactive. Thereby, the first memory circuit 1 and both the first and second write-in bit lines W0BL and W0BLC are electrically connected, so that the data item is written into the first memory circuit 1. Thus, the data write-in operation to the first memory circuit 1 is completed.

After the completion of the data write-in operation, when the level of the first write-in word line W0WL0 becomes the low level, both the fifth and twelfth NMOS transistors n5 and n12 become inactive. Thereby, the first memory circuit 1 is not connected to the both the first and second write-in bit lines W0BL and W0BLC electrically. After this state, even if both the levels of the first and second write-in bit lines W0BL and W0BLC are changed, the data item stored in the first memory circuit 1 is not changed, namely the store data item may be kept. Similarly, when a data item is written into the second memory circuit 2, it is required that the level of the second write-in word line W0WL1 is changed to the high level.

Data read-out operation

Next, the data read-out operation from the memory circuit 200 shown in FIG. 4 will be explained.

When a data item stored in the first memory circuit 1 is read out, the level of the first read-out word line R1WL0 is the high level. Because it is prevented that the levels of a plurality of read-out word lines become the high level simultaneously when the data item stored in the first memory circuit 1 is read out, the second read-out word line R1WL1 becomes the low level. Accordingly, the ninth NMOS transistor n9 becomes active, and the eighth NMOS transistors n8 become inactive. Thereby, the first memory circuit 1 is electrically connected to the read-out bit line R1BL through the tenth NMOS transistor n10, and the ninth and tenth PMOS transistors p9 and p10.

Since the read-out bit line R1BL is connected to a sense amplifier (omitted from the drawings), the data item that has been read out is transferred to circuits in following stage. Thereby, the data read-out operation from the first memory circuit 1 is completed.

Similarly, the level of the second read-out word line R1WL1 is set to the high level when a data item stored in the second memory circuit 2.

As described above, according to the memory cell circuit 200 having the layout pattern shown in FIG. 5, in order to form the memory cell circuit 200 shown in FIG. 4, a basic cell comprising a pair of the NMOS transistor and the PMOS transistor is arranged in row direction and the twelve basic cells are arranged in column direction. It is thereby possible to form memory cells, each cell has a small aspect ratio.

Furthermore, according to the memory cell circuit 200 of the second embodiment, the six basic cells are required to form one memory means. Because the number of the basic cells to be required to form one memory cell is smaller than that of the conventional memory cell, so that an area or a size of the memory cell can be reduced by approximately ¾ times when comparing with the conventional case. This causes to increase the integration of the memory cell array by approximately ¾ times when comparing with the conventional memory cell array.

Furthermore, in the memory cell circuits 100 and 200 as the first and second embodiments, the term "a PMOS transistor whose gate is separated" means that a PMOS transistor whose gate electrode is connected to a power source line and not form any channel.

According to the present invention, it is possible to form the memory cell having a small aspect ratio and it is possible to form a desired memory cell circuit by using the memory cells.

In addition, according to the present invention, it is possible to form a memory cell having a small area and it is possible to increase the integration of a memory cell array when a plurality of the memory cells are arranged in an array form.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A layout pattern of a memory cell circuit comprising:

a first memory circuit comprising a first and second invertors connected in parallel reversely, for storing data and outputting the data through an output terminal of the first invertor;

a second memory circuit comprising a third and fourth invertors connected in parallel reversely, for storing data and outputting the data through an output terminal of the third invertor;

first and second write-in bit lines on which complementary signals to each other are transferred in order to store data one of the first and second memory circuits;

a first transistor of a second conductivity type whose drain is connected to the output terminal of the first invertor, and whose source is connected to the second write-in bit line;

a second transistor of the second conductivity type whose drain is connected to the output terminal of the second invertor, and whose source is connected to the first write-in bit line;

a third transistor of the second conductivity type whose drain is connected to the output terminal of the third invertor, and whose source is connected to the second write-in bit line;

a fourth transistor of the second conductivity type whose drain is connected to the output terminal of the fourth invertor, and whose source is connected to the first write-in bit line;

a first write-in word line connected commonly to both gates of the first and second transistors of the second conductivity type and for controlling a write operation to the first memory circuit through the first and second write-in bit lines;

a second write-in word line connected commonly to both gates of the third and fourth transistors of the second conductivity type and for controlling a write operation to the second memory circuit through the first and second write-in bit lines;

first and second read-out word lines, an inactive signal is usually supplied to one of the first and second read-out word lines;

read-out bit line;

a read-out circuit for providing data stored in the first and second memory circuits to the read-out bit line based on active and inactive signals supplied to the first and second read-out word lines, wherein said read-out circuit includes transistors;

a first voltage potential line through which a first voltage potential is supplied;

a second voltage potential line through which a second voltage potential that is different from the first voltage potential in potential is supplied, wherein said first through fourth invertors include transistors of a first and a second conductivity type, and further wherein transistors of said memory cell, including at least one of said transistors of said read-out circuit, are arranged in columns and no more than a first row and a second row, one row having only transistors of a first conductivity type and the other row having only transistors of a second conductivity type.

2. A layout pattern of a memory cell circuit as claimed in claim 1, wherein the first inverter comprises: a first transistor of a first conductively type, whose gate is connected to the output terminal of the second invertor, whose source is connected to the first voltage potential line, and whose drain is connected to the output terminal of the first inverter; and a fifth transistor of the second conductively type, whose gate is connected to the output terminal of the second invertor, whose source is connected to the second voltage potential line, and whose drain is connected to the output terminal of the first inverter, the second inverter comprises: a second transistor of the first conductively type, whose gate is connected to the output terminal of the first invertor, whose source is connected to the first voltage potential line, and whose drain is connected to the output terminal of the second inverter; and a sixth transistor of the second conductively type, whose gate is connected to the output terminal of the first invertor, whose source is connected to the second voltage potential line, and whose drain is connected to the output terminal of the second inverter, the third inverter comprises: a third transistor of the first conductively type, whose gate is connected to the output terminal of the fourth invertor, whose source is connected to the first voltage potential line, and whose drain is connected to the output terminal of the third inverter; and a seventh transistor of the second conductively type, whose gate is connected to the output terminal of the fourth invertor, whose source is connected to the second voltage potential line, and whose drain is connected to the output terminal of the third inverter, and the fourth inverter comprises: a fourth transistor of the first conductively type, whose gate is connected to the output terminal of the third invertor, whose source is connected to the first voltage potential line, and whose drain is connected to the output terminal of the fourth inverter; and an eighth transistor of the second conductively type, whose gate is connected to the output terminal of the third invertor, whose source is connected to the second voltage potential line, and whose drain is connected to the output terminal of the fourth inverter.

3. A layout pattern of a memory cell circuit as claimed in claim 2, wherein the read-out circuit comprises:

a complex logical circuit comprising: a first input terminal connected to the second memory circuit; a second input terminal connected to the second read-out word line; a third input terminal connected to the first memory circuit; a fourth input terminal connected to the first read-out word line; and an output terminal, a fifth transistor of the first conductivity type, whose source is connected to the first voltage potential line, whose gate is connected to the output terminal of the complex logical circuit, and whose drain is connected to the read-out bit line;

a ninth transistor of the second conductivity type, whose source is connected to the second voltage potential line, and whose gate is connected to the output terminal of the complex logical circuit;

a tenth transistor of the second conductivity type, whose source is connected to the drain of the ninth transistor of the second conductivity type, whose gate is connected to the first read-out word line, and whose drain is connected to the read-out bit line;

an eleventh transistor of the second conductivity type, whose source is connected to the second voltage potential line, and whose gate is connected to the output terminal of the complex logical circuit; and a twelfth transistor of the second conductivity type, whose source is connected to the drain of the eleventh transistor of the second conductivity type, whose gate is connected to the second read-out word line, and whose drain is connected to the read-out bit line.

4. A layout pattern of a memory cell circuit as claimed in claim 3, wherein the complex logical circuit comprises:

a sixth transistor of the first conductivity type, whose drain is connected to the output terminal of the complex logical circuit, whose gate is connected to the fourth input terminal of the complex logical circuit;

a seventh transistor of the first conductivity type, whose drain is connected to the output terminal of the complex logical circuit, whose gate is connected to the third input terminal of the complex logical circuit, and whose source is connected to a source of the sixth transistor of the first conductivity type;

an eighth transistor of the first conductivity type, whose drain is connected to the source of the sixth transistor of the first conductivity type, whose gate is connected to the first input terminal of the complex logical circuit, and whose source is connected to the first voltage potential line;

a ninth transistor of the first conductivity type, whose drain is connected to the source of the seventh transistor of the first conductivity type, whose gate is connected to the second input terminal of the complex logical circuit, and whose source is connected to the first voltage potential line;

a thirteenth transistor of the second conductivity type, whose source is connected to the second voltage potential line, and whose gate is connected to the third input terminal of the complex logical circuit;

a fourteenth transistor of the second conductivity type, whose source is connected to the drain of the thirteenth transistor of the second conductivity type, whose gate is connected to the fourth input terminal of the complex logical circuit, a fifteenth transistor of the second conductivity type, whose gate is connected to the first input terminal of the complex logical circuit, and whose drain is connected to the output terminal of the complex logical circuit; and a sixteenth transistor of the second conductivity type, whose drain is connected to the source of the fifteenth transistor of the second conductivity type, whose gate is connected to the second input terminal of the complex logical circuit, and whose source is connected to the second voltage potential line.

5. A layout pattern of a memory cell circuit as claimed in claim 4, wherein wherein in the transistor array of the first row, the third transistor of the second conductivity type is arranged in a first column, the seventh transistor of the second conductivity type is arranged in a second column, the eighth transistor of the second conductivity type is arranged in a third column, the fourth transistor of the second conductivity type is arranged in a fourth column, the second transistor of the second conductivity type is arranged in a fifth column, the sixth transistor of the second conductivity type is arranged in a sixth column, the sixteenth transistor of the second conductivity type is arranged in a seventh column, the fifteenth transistor of the second conductivity type is arranged in an eighth column, the fourteenth transistor of the second conductivity type is arranged in a ninth column, the thirteenth transistor of the second conductivity type is arranged in a tenth column, the ninth transistor of the second conductivity type is arranged in an eleventh column, the tenth transistor of the second conductivity type is arranged in a twelfth column, the twelfth transistor of the second conductivity type is arranged in a thirteenth column, the eleventh transistor of the second conductivity type is arranged in a fourteenth column, the fifth transistor of the second conductivity type is arranged in a fifteenth column, and the first transistor of the second conductivity type is arranged in a sixteenth column, wherein each pair of following two regions is formed in a same region:

the drain region of the third transistor of the second conductivity type and the drain region of the seventh transistor of the second conductivity type;

the source region of the seventh transistor of the second conductivity type and the source region of the eighth transistor of the second conductivity type;

the drain region of the eighth transistor of the second conductivity type and the drain region of the fourth transistor of the second conductivity type;

the source region of the fourth transistor of the second conductivity type and the source region of the second transistor of the second conductivity type;

the drain region of the second transistor of the second conductivity type and the drain region of the sixth transistor of the second conductivity type;

the source region of the sixth transistor of the second conductivity type and the source region of the sixteenth transistor of the second conductivity type;

the drain region of the sixteenth transistor of the second conductivity type and the source region of the fifteenth transistor of the second conductivity type;

the drain region of the fifteenth transistor of the second conductivity type and the source region of the fourteenth transistor of the second conductivity type;

the drain region of the fourteenth transistor of the second conductivity type and the drain region of the thirteenth transistor of the second conductivity type;

the source region of the thirteenth transistor of the second conductivity type and the source region of the ninth transistor of the second conductivity type;

the drain region of the ninth transistor of the second conductivity type and the source region of the tenth transistor of the second conductivity type;

the drain region of the tenth transistor of the second conductivity type and the drain region of the twelfth transistor of the second conductivity type;

the source region of the eleventh transistor of the second conductivity type and the source region of the fifth transistor of the second conductivity type; and the drain region of the fifteenth transistor of the second conductivity type and the drain region of the first transistor of the second conductivity type, wherein in the transistor array of the second row, the third transistor of the first conductivity type is arranged in a second column, the fourth transistor of the first conductivity type is arranged in a third column, the second transistor of the first conductivity type is arranged in a sixth column, the eighth transistor of the first conductivity type is arranged in an eighth column, the seventh transistor of the first conductivity type is arranged in a ninth column, the sixth transistor of the first conductivity type is arranged in a tenth column, the ninth transistor of the first conductivity type is arranged in an eleventh column, the fifth transistor of the first conductivity type is arranged in a fourteenth column, and the first transistor of the first conductivity type is arranged in a fifteenth column, wherein each pair of following two regions is formed in a same region:

the source region of the third transistor of the first conductivity type and the source region of the fourth transistor of the first conductivity type;

the drain region of the eighth transistor of the first conductivity type and the source region of the seventh transistor of the first conductivity type;

the drain region of the seventh transistor of the first conductivity type and the drain region of the sixth transistor of the first conductivity type;

the drain region of the sixth transistor of the first conductivity type and the drain region of the ninth transistor of the first conductivity type; and the source region of the fifth transistor of the first conductivity type and the source region of the first transistor of the first conductivity type, wherein the first and second write-in bit lines are made up of a first layer wiring, the first and second write-in word lines formed on the first layer wiring are made up of a second layer wiring, the read-out word lines are made up of the second layer wiring, the read-out bit line is made up of the first layer wiring, and the first and second voltage potential lines are made up of the first layer wiring.

6. A layout pattern of a memory cell circuit as claimed in claim 3, wherein wherein in the transistor array of the first row, the third transistor of the second conductivity type is arranged in a first column, the seventh transistor of the second conductivity type is arranged in a second column, the eighth transistor of the second conductivity type is arranged in a third column, the fourth transistor of the second conductivity type is arranged in a fourth column, the second transistor of the second conductivity type is arranged in a fifth column, the sixth transistor of the second conductivity type is arranged in a sixth column, the sixteenth transistor of the second conductivity type is arranged in a seventh column, the fifteenth transistor of the second conductivity type is arranged in an eighth column, the fourteenth transistor of the second conductivity type is arranged in a ninth column, the thirteenth transistor of the second conductivity type is arranged in a tenth column, the ninth transistor of the second conductivity type is arranged in an eleventh column, the tenth transistor of the second conductivity type is arranged in a twelfth column, the twelfth transistor of the second conductivity type is arranged in a thirteenth column, the eleventh transistor of the second conductivity type is arranged in a fourteenth column, the fifth transistor of the second conductivity type is arranged in a fifteenth column, and the first transistor of the second conductivity type is arranged in a sixteenth column, wherein each pair of following two regions is formed in a same region:

the drain region of the third transistor of the second conductivity type and the drain region of the seventh transistor of the second conductivity type;

the source region of the seventh transistor of the second conductivity type and the source region of the eighth transistor of the second conductivity type;

the drain region of the eighth transistor of the second conductivity type and the drain region of the fourth transistor of the second conductivity type;

the source region of the fourth transistor of the second conductivity type and the source region of the second transistor of the second conductivity type;

the drain region of the second transistor of the second conductivity type and the drain region of the sixth transistor of the second conductivity type;

the source region of the sixth transistor of the second conductivity type and the source region of the sixteenth transistor of the second conductivity type;

the drain region of the sixteenth transistor of the second conductivity type and the source region of the fifteenth transistor of the second conductivity type;

the drain region of the fifteenth transistor of the second conductivity type and the source region of the fourteenth transistor of the second conductivity type;

the drain region of the fourteenth transistor of the second conductivity type and the drain region of the thirteenth transistor of the second conductivity type;

the source region of the thirteenth transistor of the second conductivity type and the source region of the ninth transistor of the second conductivity type;

the drain region of the ninth transistor of the second conductivity type and the source region of the tenth transistor of the second conductivity type;

the drain region of the tenth transistor of the second conductivity type and the drain region of the twelfth transistor of the second conductivity type;

the source region of the eleventh transistor of the second conductivity type and the source region of the fifth transistor of the second conductivity type; and the drain region of the fifteenth transistor of the second conductivity type and the drain region of the first transistor of the second conductivity type, wherein in the transistor array of the second row, the third transistor of the first conductivity type is arranged in a second column, the fourth transistor of the first conductivity type is arranged in a third column, the second transistor of the first conductivity type is arranged in a sixth column, the eighth transistor of the first conductivity type is arranged in an eighth column, the seventh transistor of the first conductivity type is arranged in a ninth column, the sixth transistor of the first conductivity type is arranged in a tenth column, the ninth transistor of the first conductivity type is arranged in an eleventh column, the fifth transistor of the first conductivity type is arranged in a fourteenth column, and the first transistor of the first conductivity type is arranged in a fifteenth column, wherein each pair of following two regions is formed in a same region:

the source region of the third transistor of the first conductivity type and the source region of the fourth transistor of the first conductivity type;

the drain region of the eighth transistor of the first conductivity type and the source region of the seventh transistor of the first conductivity type;

the drain region of the seventh transistor of the first conductivity type and the drain region of the sixth transistor of the first conductivity type;

the drain region of the sixth transistor of the first conductivity type and the drain region of the ninth transistor of the first conductivity type; and the source region of the fifth transistor of the first conductivity type and the source region of the first transistor of the first conductivity type, wherein the first and second write-in bit lines are made up of a first layer wiring, the first and second write-in word lines formed on the first layer wiring are made up of a second layer wiring, the read-out word lines are made up of the second layer wiring, the read-out bit line is made up of the first layer wiring, and the first and second voltage potential lines are made up of the first layer wiring.

7. A layout pattern of a memory cell circuit as claimed in claim 1, wherein the read-out circuit comprises:

a complex logical circuit comprising: a first input terminal connected to the second memory circuit; a second input terminal connected to the second read-out word line; a third input terminal connected to the first memory circuit; a fourth input terminal connected to the first read-out word line; and an output terminal, a fifth transistor of the first conductivity type, whose source is connected to the first voltage potential line, whose gate is connected to the output terminal of the complex logical circuit, and whose drain is connected to the read-out bit line;

a ninth transistor of the second conductivity type, whose source is connected to the second voltage potential line, and whose gate is connected to the output terminal of the complex logical circuit;

a tenth transistor of the second conductivity type, whose source is connected to the drain of the ninth transistor of the second conductivity type, whose gate is connected to the first read-out word line, and whose drain is connected to the read-out bit line;

an eleventh transistor of the second conductivity type, whose source is connected to the second voltage potential line, and whose gate is connected to the output terminal of the complex logical circuit; and a twelfth transistor of the second conductivity type, whose source is connected to the drain of the eleventh transistor of the second conductivity type, whose gate is connected to the second read-out word line, and whose drain is connected to the read-out bit line.

8. A layout pattern of a memory cell circuit as claimed in claim 7, wherein the complex logical circuit comprises:

a sixth transistor of the first conductivity type, whose drain is connected to the output terminal of the complex logical circuit, whose gate is connected to the fourth input terminal of the complex logical circuit;

a seventh transistor of the first conductivity type, whose drain is connected to the output terminal of the complex logical circuit, whose gate is connected to the third input terminal of the complex logical circuit, and whose source is connected to a source of the sixth transistor of the first conductivity type;

an eighth transistor of the first conductivity type, whose drain is connected to the source of the sixth transistor of the first conductivity type, whose gate is connected to the first input terminal of the complex logical circuit, and whose source is connected to the first voltage potential line;

a ninth transistor of the first conductivity type, whose drain is connected to the source of the seventh transistor of the first conductivity type, whose gate is connected to the second input terminal of the complex logical circuit, and whose source is connected to the first voltage potential line;

a thirteenth transistor of the second conductivity type, whose source is connected to the second voltage potential line, and whose gate is connected to the third input terminal of the complex logical circuit;

a fourteenth transistor of the second conductivity type, whose source is connected to the drain of the thirteenth transistor of the second conductivity type, whose gate is connected to the fourth input terminal of the complex logical circuit;

a fifteenth transistor of the second conductivity type, whose gate is connected to the first input terminal of the complex logical circuit, and whose drain is connected to the output terminal of the complex logical circuit; and a sixteenth transistor of the second conductivity type, whose drain is connected to the source of the fifteenth transistor of the second conductivity type, whose gate is connected to the second input terminal of the complex logical circuit, and whose source is connected to the second voltage potential line.

9. A layout pattern of a memory cell circuit as claimed in claim 8, wherein wherein in the transistor array of the first row, the third transistor of the second conductivity type is arranged in a first column, the seventh transistor of the second conductivity type is arranged in a second column, the eighth transistor of the second conductivity type is arranged in a third column, the fourth transistor of the second conductivity type is arranged in a fourth column, the second transistor of the second conductivity type is arranged in a fifth column, the sixth transistor of the second conductivity type is arranged in a sixth column, the sixteenth transistor of the second conductivity type is arranged in a seventh column, the fifteenth transistor of the second conductivity type is arranged in an eighth column, the fourteenth transistor of the second conductivity type is arranged in a ninth column, the thirteenth transistor of the second conductivity type is arranged in a tenth column, the ninth transistor of the second conductivity type is arranged in an eleventh column, the tenth transistor of the second conductivity type is arranged in a twelfth column, the twelfth transistor of the second conductivity type is arranged in a thirteenth column, the eleventh transistor of the second conductivity type is arranged in a fourteenth column, the fifth transistor of the second conductivity type is arranged in a fifteenth column, and the first transistor of the second conductivity type is arranged in a sixteenth column, wherein each pair of following two regions is formed in a same region:

the drain region of the third transistor of the second conductivity type and the drain region of the seventh transistor of the second conductivity type;

the source region of the seventh transistor of the second conductivity type and the source region of the eighth transistor of the second conductivity type;

the drain region of the eighth transistor of the second conductivity type and the drain region of the fourth transistor of the second conductivity type;

the source region of the fourth transistor of the second conductivity type and the source region of the second transistor of the second conductivity type;

the drain region of the second transistor of the second conductivity type and the drain region of the sixth transistor of the second conductivity type;

the source region of the sixth transistor of the second conductivity type and the source region of the sixteenth transistor of the second conductivity type;

the drain region of the sixteenth transistor of the second conductivity type and the source region of the fifteenth transistor of the second conductivity type;

the drain region of the fifteenth transistor of the second conductivity type and the source region of the fourteenth transistor of the second conductivity type;

the drain region of the fourteenth transistor of the second conductivity type and the drain region of the thirteenth transistor of the second conductivity type;

the source region of the thirteenth transistor of the second conductivity type and the source region of the ninth transistor of the second conductivity type;

the drain region of the ninth transistor of the second conductivity type and the source region of the tenth transistor of the second conductivity type;

the drain region of the tenth transistor of the second conductivity type and the drain region of the twelfth transistor of the second conductivity type;

the source region of the eleventh transistor of the second conductivity type and the source region of the fifth transistor of the second conductivity type; and the drain region of the fifteenth transistor of the second conductivity type and the drain region of the first transistor of the second conductivity type, wherein in the transistor array of the second row, the third transistor of the first conductivity type is arranged in a second column, the fourth transistor of the first conductivity type is arranged in a third column, the second transistor of the first conductivity type is arranged in a sixth column, the eighth transistor of the first conductivity type is arranged in an eighth column, the seventh transistor of the first conductivity type is arranged in a ninth column, the sixth transistor of the first conductivity type is arranged in a tenth column, the ninth transistor of the first conductivity type is arranged in an eleventh column, the fifth transistor of the first conductivity type is arranged in a fourteenth column, and the first transistor of the first conductivity type is arranged in a fifteenth column, wherein each pair of following two regions is formed in a same region:

the source region of the third transistor of the first conductivity type and the source region of the fourth transistor of the first conductivity type;

the drain region of the eighth transistor of the first conductivity type and the source region of the seventh transistor of the first conductivity type;

the drain region of the seventh transistor of the first conductivity type and the drain region of the sixth transistor of the first conductivity type;

the drain region of the sixth transistor of the first conductivity type and the drain region of the ninth transistor of the first conductivity type; and the source region of the fifth transistor of the first conductivity type and the source region of the first transistor of the first conductivity type, wherein the first and second write-in bit lines are made up of a first layer wiring, the first and second write-in word lines formed on the first layer wiring are made up of a second layer wiring, the read-out word lines are made up of the second layer wiring, the read-out bit line is made up of the first layer wiring, and the first and second voltage potential lines are made up of the first layer wiring.

10. A layout pattern of a memory cell circuit as claimed in claim 7, wherein wherein in the transistor array of the first row, the third transistor of the second conductivity type is arranged in a first column, the seventh transistor of the second conductivity type is arranged in a second column, the eighth transistor of the second conductivity type is arranged in a third column, the fourth transistor of the second conductivity type is arranged in a fourth column, the second transistor of the second conductivity type is arranged in a fifth column, the sixth transistor of the second conductivity type is arranged in a sixth column, the sixteenth transistor of the second conductivity type is arranged in a seventh column, the fifteenth transistor of the second conductivity type is arranged in an eighth column, the fourteenth transistor of-the second conductivity type is arranged in a ninth column, the thirteenth transistor of the second conductivity type is arranged in a tenth column, the ninth transistor of the second conductivity type is arranged in an eleventh column, the tenth transistor of the second conductivity type is arranged in a twelfth column, the twelfth transistor of the second conductivity type is arranged in a thirteenth column, the eleventh transistor of the second conductivity type is arranged in a fourteenth column, the fifth transistor of the second conductivity type is arranged in a fifteenth column, and the first transistor of the second conductivity type is arranged in a sixteenth column, wherein each pair of following two regions is formed in a same region:

the drain region of the third transistor of the second conductivity type and the drain region of the seventh transistor of the second conductivity type;

the source region of the seventh transistor of the second conductivity type and the source region of the eighth transistor of the second conductivity type;

the drain region of the eighth transistor of the second conductivity type and the drain region of the fourth transistor of the second conductivity type;

the source region of the fourth transistor of the second conductivity type and the source region of the second transistor of the second conductivity type;

the drain region of the second transistor of the second conductivity type and the drain region of the sixth transistor of the second conductivity type;

the source region of the sixth transistor of the second conductivity type and the source region of the sixteenth transistor of the second conductivity type;

the drain region of the sixteenth transistor of the second conductivity type and the source region of the fifteenth transistor of the second conductivity type;

the drain region of the fifteenth transistor of the second conductivity type and the source region of the fourteenth transistor of the second conductivity type;

the drain region of the fourteenth transistor of the second conductivity type and the drain region of the thirteenth transistor of the second conductivity type;

the source region of the thirteenth transistor of the second conductivity type and the source region of the ninth transistor of the second conductivity type;

the drain region of the ninth transistor of the second conductivity type and the source region of the tenth transistor of the second conductivity type;

the drain region of the tenth transistor of the second conductivity type and the drain region of the twelfth transistor of the second conductivity type;

the source region of the eleventh transistor of the second conductivity type and the source region of the fifth transistor of the second conductivity type; and the drain region of the fifteenth transistor of the second conductivity type and the drain region of the first transistor of the second conductivity type, wherein in the transistor array of the second row, the third transistor of the first conductivity type is arranged in a second column, the fourth transistor of the first conductivity type is arranged in a third column, the second transistor of the first conductivity type is arranged in a sixth column, the eighth transistor of the first conductivity type is arranged in an eighth column, the seventh transistor of the first conductivity type is arranged in a ninth column, the sixth transistor of the first conductivity type is arranged in a tenth column, the ninth transistor of the first conductivity type is arranged in an eleventh column, the fifth transistor of the first conductivity type is arranged in a fourteenth column, and the first transistor of the first conductivity type is arranged in a fifteenth column, wherein each pair of following two regions is formed in a same region:

the source region of the third transistor of the first conductivity type and the source region of the fourth transistor of the first conductivity type;

the drain region of the eighth transistor of the first conductivity type and the source region of the seventh transistor of the first conductivity type;

the drain region of the seventh transistor of the first conductivity type and the drain region of the sixth transistor of the first conductivity type;

the drain region of the sixth transistor of the first conductivity type and the drain region of the ninth transistor of the first conductivity type; and the source region of the fifth transistor of the first conductivity type and the source region of the first transistor of the first conductivity type, wherein the first and second write-in bit lines are made up of a first layer wiring, the first and second write-in word lines formed on the first layer wiring are made up of a second layer wiring, the read-out word lines are made up of the second layer wiring, the read-out bit line is made up of the first layer wiring, and the first and second voltage potential lines are made up of the first layer wiring.

11. A layout pattern of a memory cell circuit comprising:

a first memory circuit comprising a first and second invertors connected in parallel reversely, for storing data and outputting the data through an output terminal of the first invertor;

a second memory circuit comprising a third and fourth invertors connected in parallel reversely, for storing data and outputting the data through an output terminal of the third invertor;

first and second write-in bit lines on which complementary signals to each other are transferred in order to store data one of the first and second memory circuits;

a first transistor of a second conductivity type whose drain is connected to the output terminal of the first invertor, and whose source is connected to the second write-in bit line;

a second transistor of the second conductivity type whose drain is connected to the output terminal of the second invertor, and whose source is connected to the first write-in bit line;

a third transistor of the second conductivity type whose drain is connected to the output terminal of the third invertor, and whose source is connected to the second write-in bit line;

a fourth transistor of the second conductivity type whose drain is connected to the output terminal of the fourth invertor, and whose source is connected to the first write-in bit line;

a first write-in word line connected commonly to both gates of the first and second transistors of the second conductivity type and for controlling a write operation to the first memory circuit through the first and second write-in bit lines;

a second write-in word line connected commonly to both gates of the third and fourth transistors of the second conductivity type and for controlling a write operation to the second memory circuit through the first and second write-in bit lines;

first and second read-out word lines, an inactive signal is usually supplied to one of the first and second read-out word lines;

a read-out bit line;

a read-out circuit for providing data stored in the first and second memory circuits to the read-out bit line based on active and inactive signals supplied to the first and second read-out word lines, said read-out circuit including transistors;

a first voltage potential line through which a first voltage potential is supplied;

a second voltage potential line through which a second voltage potential that is different from the first voltage potential in potential is supplied, wherein said first through fourth invertors include transistors of a first and a second conductivity type, and further wherein transistors of said memory cell including at least one transistor of said read-out circuit are arranged in columns and no more than a first row and a second row, one row having only transistors of a first conductivity type and the other row having only transistors of a second conductivity type.

12. A layout pattern of a memory cell circuit as claimed in claim 11, wherein the first inverter comprises: a first transistor of a first conductively type, whose gate is connected to the output terminal of the second invertor, whose source is connected to the first voltage potential line, and whose drain is connected to the output terminal of the first inverter; and a fifth transistor of the second conductively type, whose gate is connected to the output terminal of the second invertor, whose source is connected to the second voltage potential line, and whose drain is connected to the output terminal of the first inverter, the second inverter comprises: a second transistor of the first conductively type, whose gate is connected to the output terminal of the first invertor, whose source is connected to the first voltage potential line, and whose drain is connected to the output terminal of the second inverter; and a sixth transistor of the second conductively type, whose gate is connected to the output terminal of the first invertor, whose source is connected to the second voltage potential line, and whose drain is connected to the output terminal of the second inverter, the third inverter comprises: a third transistor of the first conductively type, whose gate is connected to the output terminal of the fourth invertor, whose source is connected to the first voltage potential line, and whose drain is connected to the output terminal of the third inverter; and a seventh transistor of the second conductively type, whose gate is connected to the output terminal of the fourth invertor, whose source is connected to the second voltage potential line, and whose drain is connected to the output terminal of the third inverter, and the fourth inverter comprises: a fourth transistor of the first conductively type, whose gate is connected to the output terminal of the third invertor, whose source is connected to the first voltage potential line, and whose drain is connected to the output terminal of the fourth inverter; and an eighth transistor of the second conductively type, whose gate is connected to the output terminal of the third invertor, whose source is connected to the second voltage potential line, and whose drain is connected to the output terminal of the fourth inverter.

13. A layout pattern of a memory cell circuit as claimed in claim 12, wherein the read-out circuit comprises:

a first input terminal connected to the second memory circuit;

a second input terminal connected to the second readout word line;

a third input terminal connected to the first memory circuit;

a fourth input terminal connected to the first readout word line;

a ninth transistor of the second conductivity type, whose drain is connected to the read-out bit line of the read-out circuit, and whose gate is connected to the second input terminal connected to the second read-out word line;

a tenth transistor of the second conductivity type, whose drain is connected to the source of the ninth transistor of the second conductivity type, whose gate is connected to the first input terminal of the read-out circuit, and whose source is connected to the second voltage potential line;

a fifth transistor of the first conductivity type, whose drain is connected to the source of the ninth transistor of the second conductivity type, whose gate is connected to the first input terminal of the read-out circuit, and whose source is connected to the first voltage potential line;

a sixth transistor of the first conductivity type, whose drain is connected to the source of the ninth transistor of the second conductivity type, whose gate is connected to the first input terminal of the read-out circuit, and whose source is connected to the first voltage potential line;

an twelfth transistor of the second conductivity type, whose drain is connected to the read-out bit line, whose gate is connected to the fourth input terminal of the read-out circuit, and whose source is connected to the twelfth transistor of the second conductivity type;

a twelfth transistor of the second conductivity type, whose drain is connected to the source of the eleventh transistor of the second conductivity type, whose gate is connected to the third input terminal of the read-out circuit, and whose source is connected to the second voltage potential line;

a seventh transistor of the first conductivity type, whose drain is connected to the source of the eleventh transistor of the second conductivity type, whose gate is connected to the third input terminal of the read-out circuit, and whose source is connected to the first voltage potential line;

an eighth transistor of the first conductivity type, whose drain is connected to the source of the eleventh transistor of the second conductivity type, whose gate is connected to the third input terminal of the read-out circuit, and whose source is connected to the first voltage potential line.

14. A layout pattern of a memory cell circuit as claimed in claim 13, wherein wherein in the transistor array of the first row, the third transistor of the second conductivity type is arranged in a first column, the seventh transistor of the second conductivity type is arranged in a second column, the eighth transistor of the second conductivity type is arranged in a third column, the fourth transistor of the second conductivity type is arranged in a fourth column, the second transistor of the second conductivity type is arranged in a fifth column, the sixth transistor of the second conductivity type is arranged in a sixth column, the tenth transistor of the second conductivity type is arranged in a seventh column, the ninth transistor of the second conductivity type is arranged in an eighth column, the eleventh transistor of the second conductivity type is arranged in a ninth column, the twelfth transistor of the second conductivity type is arranged in a tenth column, the fifth transistor of the second conductivity type is arranged in an eleventh column, and the first transistor of the second conductivity type is arranged in a twelfth column, wherein each pair of following two regions is formed in a same region:

the drain region of the third transistor of the second conductivity type and the drain region of the seventh transistor of the second conductivity type;

the source region of the seventh transistor of the second conductivity type and the source region of the eighth transistor of the second conductivity type;

the drain region of the eighth transistor of the second conductivity type and the drain region of the fourth transistor of the second conductivity type;

the source region of the fourth transistor of the second conductivity type and the source region of the second transistor of the second conductivity type;

the drain region of the second transistor of the second conductivity type and the drain region of the sixth transistor of the second conductivity type;

the source region of the sixth transistor of the second conductivity type and the source region of the tenth transistor of the second conductivity type;

the drain region of the tenth transistor of the second conductivity type and the source region of the ninth transistor of the second conductivity type;

the drain region of the ninth transistor of the second conductivity type and the drain region of the eleventh transistor of the second conductivity type;

the source region of the eleventh transistor of the second conductivity type and the drain region of the twelfth transistor of the second conductivity type;

the source region of the twelfth transistor of the second conductivity type and the source region of the fifth transistor of the second conductivity type; and the drain region of the fifth transistor of the second conductivity type and the drain region of the first transistor of the second conductivity type, wherein in the transistor array of the second row, the third transistor of the first conductivity type is arranged in a second column, the fourth transistor of the first conductivity type is arranged in a third column, the second transistor of the first conductivity type is arranged in a sixth column, the fifth transistor of the first conductivity type is arranged in a seventh column, the sixth transistor of the first conductivity type is arranged in an eighth column, the seventh transistor of the first conductivity type is arranged in a ninth column, the eighth transistor of the first conductivity type is arranged in a tenth column, and the first transistor of the first conductivity type is arranged in an eleventh column, wherein each pair of following two regions is formed in a same region:

the source region of the third transistor of the first conductivity type and the source region of the fourth transistor of the first conductivity type;

the source region of the second transistor of the first conductivity type and the source region of the fifth transistor of the first conductivity type;

the drain region of the fifth transistor of the first conductivity type and the drain region of the sixth transistor of the first conductivity type;

the source region of the sixth transistor of the first conductivity type and the source region of the seventh transistor of the first conductivity type;

the drain region of the seventh transistor of the first conductivity type and the drain region of the eighth transistor of the first conductivity type, and the source region of the eighth transistor of the first conductivity type and the source region of the first transistor of the first conductivity type, wherein the first and second write-in bit lines are made up of a first layer wiring, the first and second write-in word lines formed on the first layer wiring are made up of a second layer wiring and, the read-out word lines are made up of the second layer wiring, the read-out bit line is made up of the first layer wiring, and the first and second voltage potential lines are made up of the first layer wiring.

15. A layout pattern of a memory cell circuit as claimed in claim 12, wherein wherein in the transistor array of the first row, the third transistor of the second conductivity type is arranged in a first column, the seventh transistor of the second conductivity type is arranged in a second column, the eighth transistor of the second conductivity type is arranged in a third column, the fourth transistor of the second conductivity type is arranged in a fourth column, the second transistor of the second conductivity type is arranged in a fifth column, the sixth transistor of the second conductivity type is arranged in a sixth column, the tenth transistor of the second conductivity type is arranged in a seventh column, the ninth transistor of the second conductivity type is arranged in an eighth column, the eleventh transistor of the second conductivity type is arranged in a ninth column, the twelfth transistor of the second conductivity type is arranged in a tenth column, the fifth transistor of the second conductivity type is arranged in an eleventh column, and the first transistor of the second conductivity type is arranged in a twelfth column, wherein each pair of following two regions is formed in a same region:

the drain region of the third transistor of the second conductivity type and the drain region of the seventh transistor of the second conductivity type;

the source region of the seventh transistor of the second conductivity type and the source region of the eighth transistor of the second conductivity type;

the drain region of the eighth transistor of the second conductivity type and the drain region of the fourth transistor of the second conductivity type;

the source region of the fourth transistor of the second conductivity type and the source region of the second transistor of the second conductivity type;

the drain region of the second transistor of the second conductivity type and the drain region of the sixth transistor of the second conductivity type;

the source region of the sixth transistor of the second conductivity type and the source region of the tenth transistor of the second conductivity type;

the drain region of the tenth transistor of the second conductivity type and the source region of the ninth transistor of the second conductivity type;

the drain region of the ninth transistor of the second conductivity type and the drain region of the eleventh transistor of the second conductivity type;

the source region of the eleventh transistor of the second conductivity type and the drain region of the twelfth transistor of the second conductivity type;

the source region of the twelfth transistor of the second conductivity type and the source region of the fifth transistor of the second conductivity type; and the drain region of the fifth transistor of the second conductivity type and the drain region of the first transistor of the second conductivity type, wherein in the transistor array of the second row, the third transistor of the first conductivity type is arranged in a second column, the fourth transistor of the first conductivity type is arranged in a third column, the second transistor of the first conductivity type is arranged in a sixth column, the fifth transistor of the first conductivity type is arranged in a seventh column, the sixth transistor of the first conductivity type is arranged in an eighth column, the seventh transistor of the first conductivity type is arranged in a ninth column, the eighth transistor of the first conductivity type is arranged in a tenth column, and the first transistor of the first conductivity type is arranged in an eleventh column, wherein each pair of following two regions is formed in a same region:

the source region of the third transistor of the first conductivity type and the source region of the fourth transistor of the first conductivity type;

the source region of the second transistor of the first conductivity type and the source region of the fifth transistor of the first conductivity type;

the drain region of the fifth transistor of the first conductivity type and the drain region of the sixth transistor of the first conductivity type;

the source region of the sixth transistor of the first conductivity type and the source region of the seventh transistor of the first conductivity type;

the drain region of the seventh transistor of the first conductivity type and the drain region of the eighth transistor of the first conductivity type, and the source region of the eighth transistor of the first conductivity type and the source region of the first transistor of the first conductivity type, wherein the first and second write-in bit lines are made up of a first layer wiring, the first and second write-in word lines formed on the first layer wiring are made up of a second layer wiring and, the read-out word lines are made up of the second layer wiring, the read-out bit line is made up of the first layer wiring, and the first and second voltage potential lines are made up of the first layer wiring.

16. A layout pattern of a memory cell circuit as claimed in claim 11, wherein the read-out circuit comprises:

a first input terminal connected to the second memory circuit;

a second input terminal connected to the second read-out word line;

a third input terminal connected to the first memory circuit;

a fourth input terminal connected to the first readout word line;

a ninth transistor of the second conductivity type, whose drain is connected to the read-out bit line the read-out circuit, and whose gate is connected to the second input terminal connected to the second read-out word line;

a tenth transistor of the second conductivity type, whose drain is connected to the source of the ninth transistor of the second conductivity type, whose gate is connected to the first input terminal of the read-out circuit, and whose source is connected to the second voltage potential line;

a fifth transistor of the first conductivity type, whose drain is connected to the source of the ninth transistor of the second conductivity type, whose gate is connected to the first input terminal of the read-out circuit, and whose source is connected to the first voltage potential line;

a sixth transistor of the first conductivity type, whose drain is connected to the source of the ninth transistor of the second conductivity type, whose gate is connected to the first input terminal of the read-out circuit, and whose source is connected to the first voltage potential line;

an eleventh transistor of the second conductivity type, whose drain is connected to the read-out bit line, whose gate is connected to the fourth input terminal of the read-out circuit, and whose source is connected to the twelfth transistor of the second conductivity type;

a twelfth transistor of the second conductivity type, whose drain is connected to the source of the eleventh transistor of the second conductivity type, whose gate is connected to the third input terminal of the read-out circuit, and whose source is connected to the second voltage potential line;

a seventh transistor of the first conductivity type, whose drain is connected to the source of the eleventh transistor of the second conductivity type, whose gate is connected to the third input terminal of the read-out circuit, and whose source is connected to the first voltage potential line;

an eighth transistor of the first conductivity type, whose drain is connected to the source of the eleventh transistor of the second conductivity type, whose gate is connected to the third input terminal of the read-out circuit, and whose source is connected to the first voltage potential line.

17. A layout pattern of a memory cell circuit as claimed in claim 14, wherein wherein in the transistor array of the first row, the third transistor of the second conductivity type is arranged in a first column, the seventh transistor of the second conductivity type is arranged in a second column, the eighth transistor of the second conductivity type is arranged in a third column, the fourth transistor of the second conductivity type is arranged in a fourth column, the second transistor of the second conductivity type is arranged in a fifth column, the sixth transistor of the second conductivity type is arranged in a sixth column, the tenth transistor of the second conductivity type is arranged in a seventh column, the ninth transistor of the second conductivity type is arranged in an eighth column, the eleventh transistor of the second conductivity type is arranged in a ninth column, the twelfth transistor of the second conductivity type is arranged in a tenth column, the fifth transistor of the second conductivity type is arranged in an eleventh column, and the first transistor of the second conductivity type is arranged in a twelfth column, wherein each pair of following two regions is formed in a same region:

the drain region of the third transistor of the second conductivity type and the drain region of the seventh transistor of the second conductivity type;

the source region of the seventh transistor of the second conductivity type and the source region of the eighth transistor of the second conductivity type;

the drain region of the eighth transistor of the second conductivity type and the drain region of the fourth transistor of the second conductivity type;

the source region of the fourth transistor of the second conductivity type and the source region of the second transistor of the second conductivity type;

the drain region of the second transistor of the second conductivity type and the drain region of the sixth transistor of the second conductivity type;

the source region of the sixth transistor of the second conductivity type and the source region of the tenth transistor of the second conductivity type;

the drain region of the tenth transistor of the second conductivity type and the source region of the ninth transistor of the second conductivity type;

the drain region of the ninth transistor of the second conductivity type and the drain region of the eleventh transistor of the second conductivity type;

the source region of the eleventh transistor of the second conductivity type and the drain region of the twelfth transistor of the second conductivity type;

the source region of the twelfth transistor of the second conductivity type and the source region of the fifth transistor of the second conductivity type; and the drain region of the fifth transistor of the second conductivity type and the drain region of the first transistor of the second conductivity type, wherein in the transistor array of the second row, the third transistor of the first conductivity type is arranged in a second column, the fourth transistor of the first conductivity type is arranged in a third column, the second transistor of the first conductivity type is arranged in a sixth column, the fifth transistor of the first conductivity type is arranged in a seventh column, the sixth transistor of the first conductivity type is arranged in an eighth column, the seventh transistor of the first conductivity type is arranged in a ninth column, the eighth transistor of the first conductivity type is arranged in a tenth column, and the first transistor of the first conductivity type is arranged in an eleventh column, wherein each pair of following two regions is formed in a same region:

the source region of the third transistor of the first conductivity type and the source region of the fourth transistor of the first conductivity type;

the source region of the second transistor of the first conductivity type and the source region of the fifth transistor of the first conductivity type;

the drain region of the fifth transistor of the first conductivity type and the drain region of the sixth transistor of the first conductivity type;

the source region of the sixth transistor of the first conductivity type and the source region of the seventh transistor of the first conductivity type;

the drain region of the seventh transistor of the first conductivity type and the drain region of the eighth transistor of the first conductivity type, and the source region of the eighth transistor of the first conductivity type and the source region of the first transistor of the first conductivity type, wherein the first and second write-in bit lines are made up of a first layer wiring, the first and second write-in word lines formed on the first layer wiring are made up of a second layer wiring and, the read-out word lines are made up of the second layer wiring, the read-out bit line is made up of the first layer wiring, and the first and second voltage potential lines are made up of the first lay er wiring.

* * * * *